US012564995B2

(12) United States Patent
Crivelli et al.

(10) Patent No.: US 12,564,995 B2
(45) Date of Patent: Mar. 3, 2026

(54) THERMOFORMED, INJECTION MOLDED, AND/OR OVERMOLDED MICROFLUIDIC STRUCTURES AND TECHNIQUES FOR MAKING THE SAME

(71) Applicant: Illumina, Inc., San Diego, CA (US)

(72) Inventors: Paul M. Crivelli, San Diego, CA (US); Cyril M. L. Delattre, San Diego, CA (US); Gerald Kreindl, Singapore (SG); Wesley A. Cox-Muranami, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 706 days.

(21) Appl. No.: 17/250,276

(22) PCT Filed: Jan. 15, 2020

(86) PCT No.: PCT/US2020/013615
§ 371 (c)(1),
(2) Date: Dec. 23, 2020

(87) PCT Pub. No.: WO2020/159703
PCT Pub. Date: Aug. 6, 2020

(65) Prior Publication Data
US 2021/0276241 A1 Sep. 9, 2021

Related U.S. Application Data

(60) Provisional application No. 62/799,648, filed on Jan. 31, 2019.

(51) Int. Cl.
*B29C 69/02* (2006.01)
*B01L 3/00* (2006.01)
(Continued)

(52) U.S. Cl.
CPC ........ *B29C 51/10* (2013.01); *B01L 3/502707* (2013.01); *B29C 51/082* (2013.01);
(Continued)

(58) Field of Classification Search
CPC ..... B29C 69/02; B29C 51/14; B81C 1/00071; B81C 99/0085; B01L 3/502707; B81B 1/006
See application file for complete search history.

(56) References Cited

U.S. PATENT DOCUMENTS 7,159,618 B2 1/2007 Broyer et al.
9,278,353 B2 3/2016 Smith et al.
(Continued)

FOREIGN PATENT DOCUMENTS

CN 102785316 A 11/2012
CN 103209829 A 7/2013
(Continued)

OTHER PUBLICATIONS

International Search Report and Written Opinion mailed Jun. 2, 2020, in PCT/US2020/013615.
(Continued)

*Primary Examiner* — Randy Boyer
(74) *Attorney, Agent, or Firm* — Weaver Austin Villeneuve & Sampson LLP

(57) ABSTRACT

Laminated microfluidic structures and methods for manufacturing the same are provided. In some instances, a laminated microfluidic structure is provided which includes a distended region having a sipper port at the bottom and an internal channel that fluidically connects the sipper port to a location outside of the distended region. Thermoforming and/or injection molding techniques for manufacturing such laminated microfluidic structures are provided. In other instances, a laminated microfluidic structure may be co-
(Continued)

molded with a polymeric material to produce an integrated laminated microfluidic structure and housing.

20 Claims, 17 Drawing Sheets

(51) Int. Cl.

| | |
|---|---|
| *B29C 51/08* | (2006.01) |
| *B29C 51/10* | (2006.01) |
| *B29C 51/14* | (2006.01) |
| *B81B 1/00* | (2006.01) |
| *B81C 1/00* | (2006.01) |
| *B81C 99/00* | (2010.01) |
| *B29L 31/00* | (2006.01) |

(52) U.S. Cl.

CPC .............. *B29C 51/14* (2013.01); *B29C 69/02* (2013.01); *B81B 1/006* (2013.01); *B81C 1/00071* (2013.01); *B81C 99/0085* (2013.01); *B01L 2200/06* (2013.01); *B01L 2200/0684* (2013.01); *B01L 2200/0689* (2013.01); *B01L 2200/12* (2013.01); *B01L 2300/048* (2013.01); *B01L 2300/123* (2013.01); *B29L 2031/753* (2013.01); *B29L 2031/756* (2013.01); *B81B 2201/05* (2013.01); *B81B 2203/0338* (2013.01)

(56) References Cited

U.S. PATENT DOCUMENTS

| | | | |
|---|---|---|---|
| 9,878,327 | B2 | 1/2018 | Smith et al. |
| 9,968,930 | B2 | 5/2018 | Babcock |
| 10,046,893 | B2 | 8/2018 | Janta et al. |
| 2004/0191896 | A1 | 9/2004 | Miao et al. |
| 2006/0180223 | A1 | 8/2006 | Broyer et al. |
| 2011/0053806 | A1 | 3/2011 | Amin |
| 2011/0186466 | A1 | 8/2011 | Kurowski et al. |
| 2012/0230887 | A1 | 9/2012 | Zucchelli |
| 2013/0042888 | A1 | 2/2013 | Zucchelli |
| 2013/0108801 | A1 | 5/2013 | Naessens et al. |
| 2014/0378348 | A1* | 12/2014 | Makarewicz, Jr. .......................... B01L 3/502746 506/40 |
| 2015/0336096 | A1 | 11/2015 | Smith et al. |
| 2016/0038940 | A1 | 2/2016 | Babcock |
| 2016/0263574 | A1 | 9/2016 | Smith et al. |
| 2017/0291747 | A1 | 10/2017 | Janta et al. |
| 2018/0214874 | A1 | 8/2018 | Koksal et al. |

FOREIGN PATENT DOCUMENTS

| | | | | |
|---|---|---|---|---|
| CN | 107206375 | | 9/2017 | |
| DE | 19610707 | C2 | 4/1998 | |
| DE | 10134040 | A1 * | 2/2003 | ............. B29C 51/12 |
| EP | 0740605 | B1 | 12/2003 | |
| EP | 2769767 | | 8/2014 | |
| EP | 2769767 | A3 | 9/2014 | |
| JP | H06500727 | A | 1/1994 | |
| JP | 10-19895 | | 1/1998 | |
| JP | 10019895 | A * | 1/1998 | |
| JP | 11-58437 | | 3/1999 | |
| TW | 200831275 | | 8/2008 | |
| WO | WO-9201513 | A1 | 2/1992 | |
| WO | WO 2020159703 | | 8/2020 | |

OTHER PUBLICATIONS

Gale, Bruce K., A Review of Current Methods in Microfluidic Device Fabrication and Future Commercialization Prospects, Inventions, Aug. 28, 2018, vol. 3, Issue 3, Article No. 60, pp. 1-25.

Tsao et al., Bonding of thermoplastic polymer microfluidics, Microfluid Nanofluid (2009) 6:1-16.

A Vacuum Forming Guide, Formech International Ltd., 64 pages. Downloaded prior to Jan. 31, 2019.

Taiwanese Examination Report dated Mar. 20, 2021, in Application No. 109102494.

CN Office Action dated Oct. 17, 2023 in CN Application No. 202080003618.7 with English translation.

EP Partial Supplementary European search report dated Sep. 16, 2022, in Application No. EP20749172.1.

SG Office Action dated Sep. 5, 2022, in Application No. SG11202012943U.

* cited by examiner

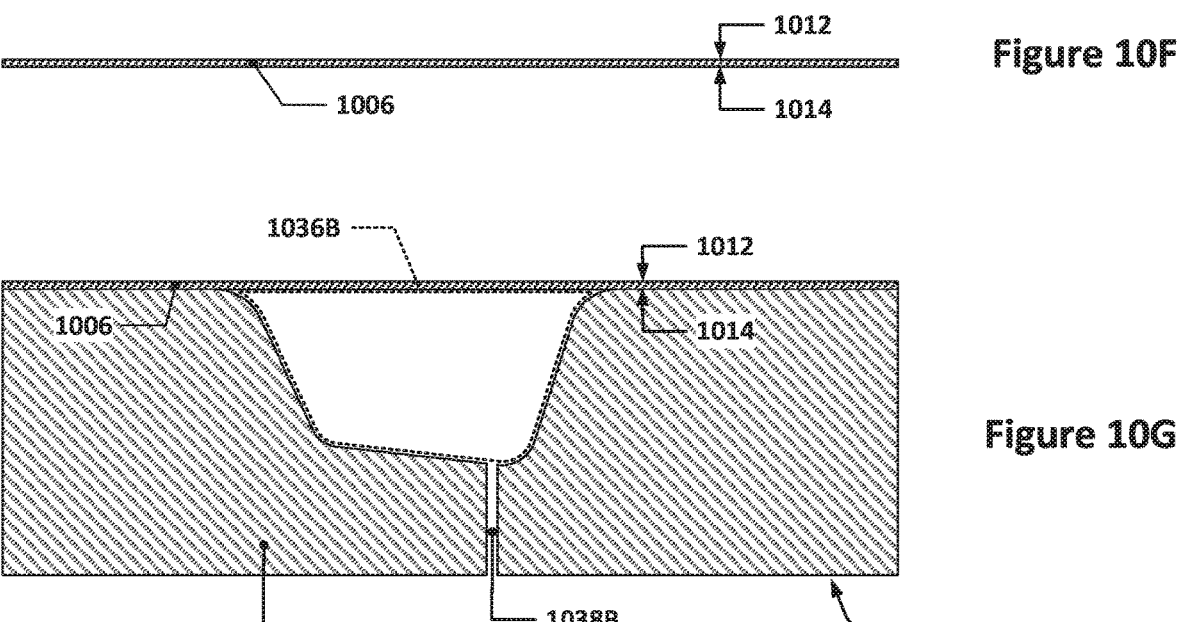
Figure 10F
Figure 10G
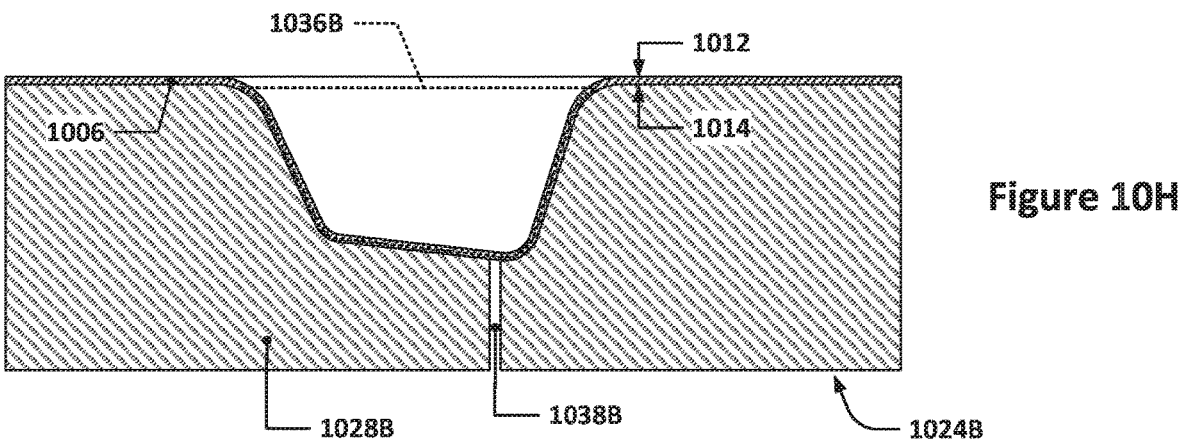
Figure 10H

1162

THERMOFORMED, INJECTION MOLDED, AND/OR OVERMOLDED MICROFLUIDIC STRUCTURES AND TECHNIQUES FOR MAKING THE SAME

CROSS-REFERENCE TO RELATED APPLICATIONS

The present application claims priority to U.S. Provisional Patent Application No. 62/799,648 filed on Jan. 31, 2019 and entitled "THERMOFORMED, INJECTION MOLDED, AND/OR OVERMOLDED MICROFLUIDIC STRUCTURES AND TECHNIQUES FOR MAKING THE SAME," which is hereby incorporated herein by reference in its entirety.

BACKGROUND

Chemical and biological assay techniques, such as genomic sequencing, can be performed by systems that use microfluidic structures to convey fluids between different locations. Such microfluidic structures can take the form of a laminated glass or polymeric structure having internal flow paths, vias, diaphragm pumps, valves, etc. housed within it. The liquids or other reagents, however, can be stored in reservoirs that are not integrated into the microfluidic structure; this is due to a multitude of reasons. For example, the total amounts of reagents used for a given microfluidic structure can exceed the available free volume within the microfluidic structure, making storage within the microfluidic structure infeasible. In some instances, long-term storage within a microfluidic structure may be problematic due to structural and sealing constraints on such structures, necessitating a more robust off-structure storage solution.

One reservoir type that may be used to store reagents for microfluidic structures is a flexible bladder that may be secured to a microfluidic structure using a pressure-sensitive adhesive and that may have a burstable release valve that may be sealed to a small port on the microfluidic structure so that when sufficient pressure is applied to the bladder, the release valve will burst open and allow the reagent contained within the bladder to be flowed into the microfluidic structure.

Another example reservoir type that may be used to store reagents for microfluidic structures may be located in a completely different location from the microfluidic structure, e.g., within an analysis instrument that may receive a cartridge containing the microfluidic structure. In such systems, some form of fluidic routing mechanism, e.g., a flexible fluid conduit, may be used to connect the external reservoirs to a port or ports on the exterior of the microfluidic structure; such connections may be made via a pressure sensitive adhesive patch or other mechanism that may provide adequate sealing.

Generally speaking, microfluidic structures tend to be leak-free within the microfluidic structure, but fluidic interfaces between such microfluidic structures and other components introduce opportunities for leaks to develop. The concepts discussed herein provide for new manufacturing techniques and structures that provide mechanisms for reducing the chances of leakage for a microfluidic structure.

SUMMARY

A variety of manufacturing methods for microfluidic structures are disclosed herein, as well as various structures that may be manufactured through such techniques and which may provide for enhanced microfluidic structures that provide for a reduced chance of leakage, more compact designs, and better overall operation. The techniques discussed herein may fall into several categories, such as techniques involving thermoforming, injection molding, and/or injection co-molding or overmolding; it will be understood that, in some implementations, such techniques may be combined or used at different stages during the manufacture of a microfluidic structure, whereas in other implementations, only one or two of such techniques may be performed in the manufacture of the a given microfluidic structure.

In some implementations, a microfluidic structure may be provided that features an integral well for reagent storage. Such a microfluidic structure may generally have a structure similar to that of a microfluidic plate, i.e., generally planar in nature, but may have regions where the "plate" is distended, e.g., bulged outward from the plane of the plate, to form a well. Such microfluidic structures may include an internal flow passage or channel that extends from a sipper port located at the bottom of the well to another location outside of the distended region/well; liquid that is present in the well may be drawn from the well through the sipper port, through the channel in the well wall, and into one or more downstream locations in the microfluidic structure.

Such microfluidic structures may be provided through a variety of techniques. In one such technique, a planar laminated microfluidic structure may be manufactured using polymeric materials according to various techniques, e.g., with channels, vias, and other microfluidic features being formed in various layers that are then bonded together to form the laminated microfluidic structure. The planar laminated microfluidic structure may include, for example, channels and sipper ports in regions of the microfluidic structure that may be distended in a later manufacturing step. The laminated microfluidic structure may then be subjected to a thermoforming process in which such regions are caused to distend or deform; the channels within the laminated microfluidic structure in the distended regions may deform with the deformation of the laminated microfluidic structure, resulting in a channel that follows a path that conforms to the walls of the well formed by such deformation.

In an alternative technique, the deformation of a laminated microfluidic structure may occur before the laminate is formed, or at least completed. In such a technique, two or more layers or sets of layers may be independently deformed so as to have complementary well shapes, e.g., via thermoforming, so that the deformed regions of one layer or set of layers may be nested within the deformed regions of the other layer or set of layers; the mating surfaces of one or both layers or sets of layers may have a channel formed within the deformed area that leads from a sipper port within the "inner" deformed region to a location outside of the deformed area. The two layers or sets of layers may then be stacked together with the deformed regions nested together and bonded to provide a laminated structure similar to that discussed previously. An alternative technique that may be used may use injection molding instead of thermoforming to form the various layers with the wells, channels, and ports already present; these layers may then be stacked with the wells nested together and bonded.

The laminated microfluidic structures discussed above may provide relatively large-volume reservoirs (the "wells") that may be used to store reagents; such wells may be left "open" to allow such reagents to be added with some form of pipette or dropper during use or may be pre-filled with such reagents and then sealed with an impermeable membrane or layer that is bonded to the undeformed perimeter around each such well to provide a high-quality and generally leak-proof seal.

In some other or additional implementations, a microfluidic structure may be subjected to a co-molding or overmolding process. Co-molding or overmolding (also sometimes referred to as two-shot molding, in-mold labeling, or in-mold decoration) refers to an injection molding process in which a preexisting part is inserted into an injection molding cavity, either in whole or in part, and then molten material is then injected into the cavity; the molten material will flow around the preexisting part or a portion thereof, filling the injection cavity voids. The resulting injection molded part will thus be a hybrid of material from the preexisting part and the solidified molten material that was injected into the mold cavity and allowed to cool. Depending on the nature of the materials used, the preexisting part may be mechanically interlocked with the injection molded part, chemically joined with the injection molded part (such as when the heat from the molten injected material causes the outer surface of the preexisting part to partially melt and fuse with the molten injected material), or both. In some implementations, a thermally actuated adhesive can be applied to the preexisting part or a portion thereof. For instance, a thermally actuated adhesive can be applied to a film before being placed in the mold to enhance bonding between the film and the molded part. The preexisting part used in such a process may itself be an injection molded part, or may be manufactured using other techniques, e.g., machining, thermoforming, laminating, etc.; different materials may be used in the preexisting part and for the injection molding process.

In the context of a microfluidic structure, a laminated microfluidic structure (such as a laminated microfluidic structure or a laminated microfluidic structure with wells formed within it, as discussed above) may be used as the preexisting part in a co-molding or overmolding injection molding process that may be used to overmold or co-mold a larger housing, e.g., a cartridge housing, that is joined to the laminated microfluidic structure in a liquid-tight manner. Such a housing may include, for example, reservoirs (or at least sidewalls thereof) that may be used to store reagents and/or recesses or bosses that may be sized to interface with corresponding mating features on an analysis instrument to provide for fluids to be transported to and/or from the laminated microfluidic structure. In some such implementations, the laminated microfluidic structure may include an elastomeric membrane as an exterior surface such that the injection-molded material may interface with some regions of the membrane while leaving other regions of the membrane untouched by the injection-molded material. Such an arrangement may help secure the membrane relative to the laminated microfluidic structure while allowing, for example, application of pressurized air to selected areas of the membrane to allow for actuation of diaphragm pumps and valves that incorporate the membrane.

While the above discussion gives a general overview of the material of this disclosure, at least the following specific implementations are contemplated as being within the scope of this disclosure; the following implementations are not intended to be an exclusive list of implementations, and other implementations will be evident from the remainder of this disclosure and the figures as well and are considered to be within the scope of this disclosure.

In some implementations, a method may be provided that includes (a) forming a laminated microfluidic structure having a first major surface and a second major surface offset from the first major surface by a first distance along an axis perpendicular to the first major surface. The laminated microfluidic structure may include at least two layers (each layer made of a polymeric material), at least one channel that may extend in one or more directions parallel to the first major surface and may be located within the laminated microfluidic structure, and one or more sipper ports that fluidically connect one or more openings in the first major surface with the at least one channel. The method may further include (b) placing the laminated microfluidic structure in a thermoforming apparatus, and (c) thermoforming a first region of the laminated microfluidic structure around the one or more sipper ports to cause the first region to distend away from a reference plane defined by undistended portions of the first major surface to form a well with the one or more sipper ports located within the distended first region.

In some implementations of the method, the laminated microfluidic structure may further include one or more vent ports in the first region. The one or more vent ports may be fluidically connected with one or more vent channels that lead to a location outside of the first region.

In some implementations of the method, (c) may include heating at least the first region to a first temperature above a glass transition temperature of the polymeric material or materials of the at least two layers, positioning the at least two layers between (i) a first mold having a protrusion in a location that aligns with the first region when viewed along an axis perpendicular to the reference plane and (ii) a second mold having a recess in a location that aligns with the first region when viewed along an axis perpendicular to the reference plane, and causing, while the first region is heated to the first temperature, one or both of the first mold and the second mold to move along a first axis to compress the at least two layers between the first mold and the second mold and cause the first region to distend into the recess.

In some such implementations of the method, at least one of the protrusion and the recess may include a relief groove on a surface thereof and positioned such that the relief groove at least partially overlaps with the at least one channel during (c) when viewed along an axis perpendicular to the reference plane.

In some implementations of the method, (c) may include placing the second major surface against a mold with a recess in a location that aligns with the first region when viewed along an axis perpendicular to the reference plane, heating at least the first region to a first temperature above a glass transition temperature of the polymeric material or materials of the at least two layers, and applying a pressure differential to the laminated microfluidic structure while the second major surface is placed against the mold, the recess is in the location that aligns with the first region, and the at least the first region is heated above the glass transition temperature of the polymeric material or materials of the at least two layers to cause the first region to thermoplastically distend into the recess.

In some such implementations of the method, the recess may include a relief groove on a surface thereof and positioned such that the relief groove at least partially overlaps with the at least one channel during (c) when viewed along an axis perpendicular to the reference plane.

In some implementations of the method, (c) may include placing the first major surface against a mold with a protrusion in a location that aligns with the first region, heating at least the first region to a first temperature above a glass transition temperature of the polymeric material or materials of the at least two layers, and applying a pressure differential to the laminated microfluidic structure while the first major surface is placed against the mold and the protrusion is in the location that aligns with the first region to cause the first region to thermoplastically distend over the protrusion.

In some such implementations of the method, the protrusion may include a relief groove on a surface thereof and positioned such that the relief groove at least partially overlaps with the at least one channel during (c) when viewed along an axis perpendicular to the reference plane.

In some implementations of the method, (c) may include heating at least the first region to a first temperature above a glass transition temperature of the polymeric material or materials of the at least two layers and causing, while the first region is heated to the first temperature, a first pressure field to be applied to the first major surface over the first region and a second pressure field to be applied to the second major surface over the first region. In such implementations, the first pressure field may, on average, be greater than the second pressure field and may result in a pressure field differential between the first major surface and the second major surface, and the pressure field differential may cause the first region to distend away from the first major surface.

In some implementations of the method, the method may further include dispensing a quantity of reagent into the distended first region, and bonding or adhering a seal over the distended first region after the quantity of reagent is dispensed into the distended first region.

In some implementations of the method, the method may further include (d) positioning, after (c), the laminated microfluidic structure within a mold cavity of an injection molding machine mold, and (e) injecting molten polymeric material into the mold cavity to cause at least some of the molten polymeric material to flow against one or more portions of the laminated microfluidic structure positioned therein.

In some implementations of the method, the method may further include obtaining a housing made of a polymeric material, heating the laminated microfluidic structure to a temperature above a glass transition temperature of the polymeric material or materials of the at least two layers, and pressing one or more portions of the laminated microfluidic structure against the housing to bond the laminated microfluidic structure to the housing.

In some implementations of the method, the laminated microfluidic structure may include one or more ports on one or both of the first major surface and the second major surface, and the injection molding machine mold may include one or more protrusions that contact the laminated microfluidic structure around each port of all or a subset of the one or more ports during (e), thereby preventing the molten polymeric material from flowing into the ports in the all or subset of one or more ports during (e).

In some implementations, a method may be provided that includes (a) obtaining a first microfluidic layer having a first major surface and a second major surface on an opposite side of the first microfluidic layer from the first major surface. The first major surface may have a concave shape in a first region of the first microfluidic layer and the second major surface may have a corresponding convex shape in the first region of the first microfluidic layer. Furthermore, the first microfluidic layer may include one or more sipper ports located within the first region and passing through the first microfluidic layer. The method may further include (b) obtaining a second microfluidic layer having a third major surface and a fourth major surface on an opposite side of the second microfluidic layer from the third major surface. The third major surface may have a concave shape in a second region of the second microfluidic layer and the fourth major surface may have a corresponding convex shape in the second region of the second microfluidic layer; the second major surface and the third major surface may have matching profiles and one or both of the first major surface and the second major surface may include one or more channels. The method may further include (c) stacking the first microfluidic layer and the second microfluidic layer such that the first region is nested in the second region and the one or more channels is in fluidic communication with the one or more sipper ports in between the first major surface and the fourth major surface and (d) bonding at least a portion of the second major surface of the first microfluidic layer to at least a portion of the third major surface of the second microfluidic layer.

In some implementations of the method, the method may further include providing at least one of (i) the concave shape of the first major surface and the convex shape of the second major surface and (ii) the concave shape of the third major surface and the convex shape of the fourth major surface by injection molding at least one of the first microfluidic layer and the second microfluidic layer, respectively.

In some implementations of the method, the method may further include providing at least one of (i) the concave shape of the first major surface and the convex shape of the second major surface and (ii) the concave shape of the third major surface and the convex shape of the fourth major surface by thermoforming at least one of the first microfluidic layer and the second microfluidic layer, respectively.

In some such implementations of the method, the second major surface may include at least one of the one or more channels, the first microfluidic layer may be thermoformed using a mold having a recess with a recessed surface positioned so as to contact the second major surface within the first region, and the recess may include a debossing feature that is proud of the recessed surface and that forms the channel in the second major surface during the thermoforming of the first microfluidic layer.

In some implementations of the method, the third major surface may include at least one of the one or more channels, the second microfluidic layer may be thermoformed using a mold having a protrusion surface positioned so as to contact the third major surface within the second region, and the protrusion may include a debossing feature that is proud of the protrusion surface and that forms the channel in the third major surface during the thermoforming of the second microfluidic layer.

In some implementations, an apparatus may be provided that includes a laminated microfluidic structure having a first major surface and a second major surface offset from the first major surface. The laminated microfluidic structure may have a first distended region that may include a concave portion of the first major surface and a corresponding convex portion of the second major surface, a sipper port may be located on the first major surface within the first distended region, and a channel that may fluidically connect the sipper port to a location outside of the first distended region and that may be interposed between the first major surface and the second major surface.

In some implementations of the apparatus, the apparatus may further include a first quantity of reagent located within the concave portion of the first major surface and a seal that is sealed to the first major surface around the periphery of the first distended region.

In some implementations of the apparatus, the apparatus may further include a vent port located on the first major surface within the first distended region and a vent channel that fluidically connects the vent port to a location outside of the first distended region and that may be interposed between the first major surface and the second major surface.

In some implementations of the apparatus, the laminated microfluidic structure may be a laminated microfluidic structure including at least a first layer and a second layer, the first layer may include a third major surface, the second layer may include a fourth major surface, the third major surface may be bonded to the fourth major surface, and the channel may be located in one or both of the third major surface and the fourth major surface.

In some implementations of the apparatus, the first distended region may be surrounded by a first non-distended region of the laminated microfluidic structure, the first non-distended region of the laminated microfluidic structure may define a first reference plane, and the sipper port may be positioned in a location that is spaced away from the first reference plane along an axis perpendicular to the first reference plane by a distance of between 90% and 100% of the distance between the first reference plane and a portion of the first major surface within the first distended region that is furthest from the first reference plane.

In some implementations of the apparatus, the apparatus may further include one or more additional distended regions, each additional distended region having a corresponding additional sipper port and a corresponding additional channel that fluidically connects that additional sipper port to a location outside of the corresponding additional distended region and that is interposed between the first major surface and the second major surface.

In some implementations of the apparatus, the apparatus may further include a co-molded housing that is fused to the laminated microfluidic structure in a co-molding process.

In some implementations of the apparatus, the apparatus may further include a co-molded housing and the laminated microfluidic structure may be located within the co-molded housing in a position that prevents the laminated microfluidic structure from being removed from the co-molded housing without deforming the co-molded housing or the laminated microfluidic structure.

In some implementations, the apparatus may further include a molded housing made from a polymeric material that may be fused to the laminated microfluidic structure in a thermoforming process and may therefore be joined to the molded housing by a region of polymeric material of the molded housing that is molecularly entangled with polymeric material of the laminated microfluidic structure.

In some implementations of the apparatus, the laminated microfluidic structure may include one or more rigid polymeric layers and an elastomeric membrane that may be in contact with one of the rigid polymeric layers on one side and that may contact the co-molded housing on an opposing side.

In some implementations of the apparatus, the rigid polymeric layer that may contact the elastomeric membrane may include a diaphragm recess and the co-molded housing may extend around the diaphragm recess but may not overlap with the diaphragm recess when viewed along an axis perpendicular to the first major surface within the first distended region.

In some implementations of the apparatus, the apparatus may include a laminated microfluidic structure having a first major surface and a second major surface offset from the first major surface. The laminated microfluidic structure may include one or more channels and vias interposed between the first major surface and the second major surface. The apparatus may also include a co-molded housing that may be fused to the laminated microfluidic structure in a co-molding process.

In some implementations of such an apparatus, the apparatus may further include a co-molded housing. The laminated microfluidic structure may be located within the co-molded housing in a position that prevents the laminated microfluidic structure from being removed from the co-molded housing without deforming the co-molded housing or the laminated microfluidic structure.

In some implementations of the apparatus, the laminated microfluidic structure may include one or more rigid polymeric layers and an elastomeric membrane that may be in contact with one of the rigid polymeric layers on one side and that may contact the co-molded housing on an opposing side.

In some implementations of the apparatus, the rigid polymeric layer that may contact the elastomeric membrane may include a diaphragm recess and the co-molded housing may extend around the diaphragm recess but may not overlap with the diaphragm recess when viewed along an axis perpendicular to the first major surface within the first distended region.

It should be appreciated that all combinations of the foregoing concepts and additional concepts discussed in greater detail below are contemplated as being part of the inventive subject matter disclosed herein and can be implemented in any combinations to achieve the benefits as described herein.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIGS. 10A through 10J depict various stages in a manufacturing process involving thermoforming and a laminated microfluidic structure that is assembled subsequent to thermoforming.

The above Figures are merely representative examples of implementations falling within the scope of this disclosure and the disclosure is to be understood as not being limited to only the implementations depicted in the Figures. Other implementations will be apparent to those of ordinary skill in the art and are also considered to be within the scope of this disclosure.

DETAILED DESCRIPTION

As discussed earlier, new techniques for manufacturing laminated microfluidic structures are contemplated that allow for such laminated microfluidic structures to deviate from uniform-thickness, planar structures and adopt a generally uniform-thickness non-planar structure. In particular such laminated microfluidic structures may include wells for housing reagents; microfluidic channels may extend into the well regions, allowing for such channels to fluidically connect with sipper ports located within the wells and allow reagents contained within the wells to be withdrawn from the wells. As used herein, the term "sipper port" will be understood to refer to a port that is positioned so as to allow fluid to be withdrawn from a well or other structure configured to contain a fluid. Various techniques for manufacturing such laminated microfluidic structures are discussed below with respect to the Figures.

One technique for manufacturing such laminated microfluidic structures involves assembling a laminated microfluidic structure and then, subsequent to such assembly, subjecting the laminated microfluidic structure to a thermoforming process to cause one or more portions of the otherwise generally planar laminated microfluidic structure to distend and form one or more corresponding wells for reagent storage. FIGS. 1A through 1G depict cross-sectional views of various stages in such a manufacturing process.

Figure 1A:
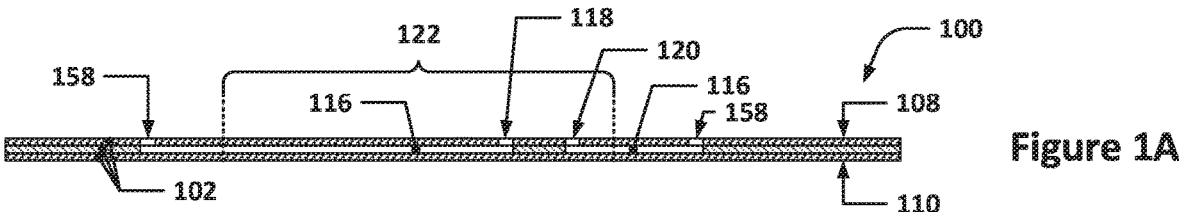
FIGS. 1A through 1G depict cross-sectional views of various stages in a thermoforming manufacturing process for a laminated microfluidic structure.

FIG. 1A depicts a cross-sectional view of a laminated microfluidic structure 100 that is formed from a plurality layers 102 (in this case, three—although more or fewer layers may be used, depending on the complexity of the laminated microfluidic structure). In some implementations, the layers 102 may, for example, each be between 0.1 mm and 1 mm thick, inclusive, and may be made of materials such as polystyrenes, polycarbonates, poly-methyl methacrylate, polyethylene terephthalate (PET), and other suitable materials. For the thermoforming-based techniques discussed herein, the total thickness of a laminated microfluidic structure may be on the order of 0.5 mm or between 0.3 mm and 3 mm, inclusive, thick.

The outermost layers 102 of the laminated microfluidic structure 100 may define a first major surface 108 and a second major surface 110 that is offset from the first major surface 108 by a first distance (equal to the overall thickness of the laminated microfluidic structure 100) along an axis that is perpendicular to the first major surface 108 (or, for that matter, the second major surface 110). A first region 122 of the laminated microfluidic structure may be selected to be distended via a thermoforming process.

In this example, the first region 122 has two channels 116 that extend into it; one channel 116 is fluidically connected with a sipper port 118 leading to an opening in the first major surface, whereas the other channel 116 is fluidically connected with a vent port 120 that leads to another opening in the first major surface (these channels may also be referred to herein as "sipper channels" and "vent channels," respectively). The channels 116 generally extend in one or more directions parallel to the first major surface 108 and are located within the laminated microfluidic structure 100. The sipper port 118 and the vent port 120 are both located within the first region 122 and may be fluidically connected, via their respective channels 116, with other features in the laminated microfluidic structure 100. In this particular example, each channel 116 leads to another respective port 158 located outside of the first region 122, although it will be understood that such channels 116 may lead to other features within the laminated microfluidic structure 100, e.g., to valves, pumps, other channels, etc. depending on the particular design of the laminated microfluidic structure 100.

Figure 1B:
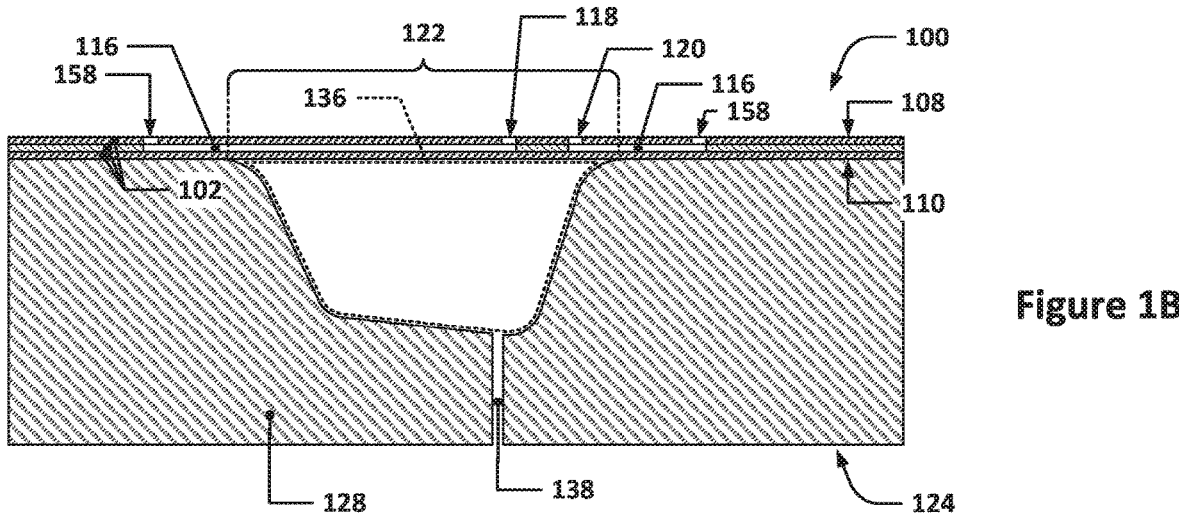

In FIG. 1B, the laminated microfluidic structure 100 of FIG. 1A has been placed with the second major surface 110 contacting a thermoforming apparatus 124. The thermoforming apparatus 124 may include a mold 128 that has a recess 136 in it in the shape of the desired well; the laminated microfluidic structure 100 may be positioned relative to the mold 128 so that the first region 122 aligns with the recess 136 when viewed along an axis perpendicular to the reference plane, e.g., the first region 122 may generally be coextensive with the recess 136 when viewed along an axis perpendicular to the reference plane. In some implementations, one or more vacuum ports 138 may be provided in the mold 128 to allow a negative gauge pressure to be drawn on the recess 136 when the laminated microfluidic structure 100 is adjacent to the periphery of the recess 136.

Figure 1C:
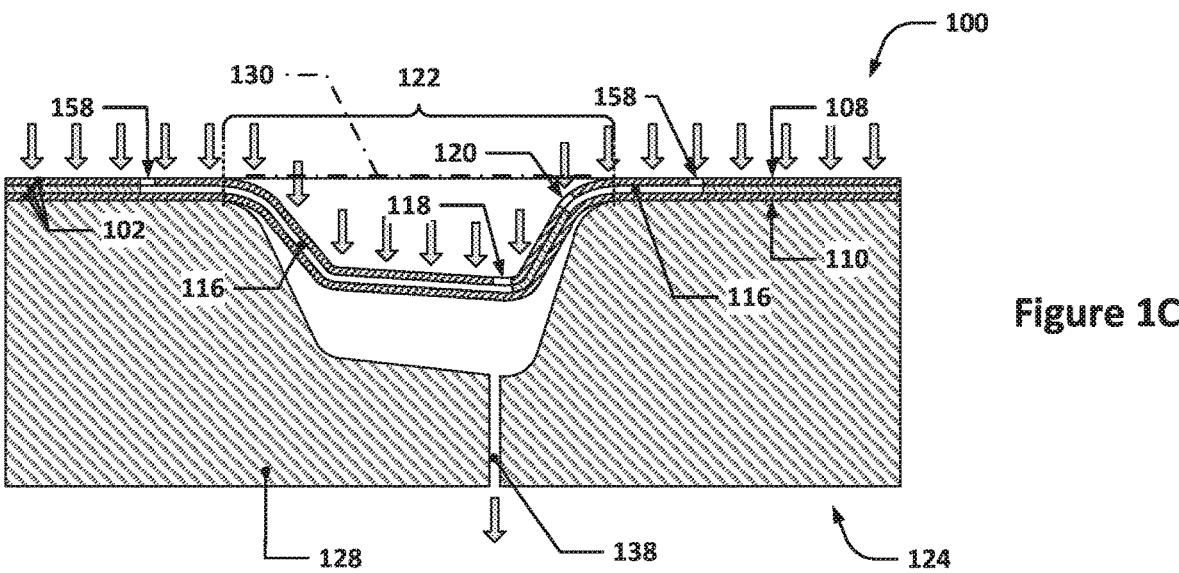

Once the laminated microfluidic structure 100 is in position relative to the mold 128, the laminated microfluidic structure 100 may be heated up to a temperature above the glass transition temperature but, ideally, below the temperature at which the material of the laminated microfluidic structure 100 transitions to a viscous state; the range of suitable temperatures for thermoforming operations may vary from material to material, although it is generally referred to herein as "thermoforming temperature" or the like. When a polymeric material is at a temperature within this range, it will generally become soft and pliable, allowing for thermoforming to be performed. Once the laminated microfluidic structure 100 is within a temperature range suitable for thermoforming, a pressure field may be applied to the laminated microfluidic structure 100 such that a positive pressure differential exists between the first major surface 108 and the second major surface 110 within the first region 122, i.e., the average pressure on the first major surface in the first region 122 is greater than the average pressure on the second major surface in the first region 122. Such a pressure differential may be produced by drawing a vacuum on the vacuum port 138, pressurizing the space immediately above the first major surface 108, or both. This pressure differential will cause the softened laminated microfluidic structure 100 to distend into the recess 136, as shown in FIG. 1C (in FIG. 1C, a positive pressure has been applied to the first major surface 108, and a negative pressure has been applied to the second major surface 110 via the vacuum port 138; it may still be desirable to have the vacuum port 138 even in implementations where no negative pressure is applied in order to provide a path for air trapped within the recess 136 to escape). As can be seen, the distension of the laminated microfluidic structure 100 in the first region 122 causes the distended portion to displace from the reference plane 130 that is defined by the non-distended portions of the laminated microfluidic structure 100.

The channels 116 in the distended first region 122 may generally distend in concert with the surrounding portions of the laminated microfluidic structure 100, causing them to adopt the same distended cross-sectional profile as the layers or portions of layers in between the channels 116 and the first major surface 108 and the second major surface 110. The result, as shown in FIG. 1D, which shows the laminated microfluidic structure 100 in a fully distended configuration within the mold 128, and FIG. 1E, which shows the thermoformed laminated microfluidic structure 100 after removal from the mold 128, is a component that has a generally uniform thickness (although there will be some thinning in the regions of the laminated microfluidic structure 100 that have been deformed/distended due to being stretched) but provides for a well 126 that has an integrated sipper port 118 located at the bottom and connected to a channel 116 that is located within the walls of the well 126 (allowing the entire contents of the well 126 to be easily withdrawn through the bottom of the well 126 and conveyed to a location in the laminated microfluidic structure 100 that is in the undistended portion of the laminated microfluidic structure 100).

Generally speaking, the channels 116 in a laminated microfluidic structure may, in some implementations, have a cross-sectional aspect ratio that is generally square, or may have a depth-to-width ratio of, for example, 1.5:1 or 1:1.5, inclusive. In some implementations, the channels 116 may, for example, be 0.3 mm deep by 0.3 mm wide. It will be understood that other channel implementations may feature different dimensions.

Figures 1D, 1E, 1F, 1G:
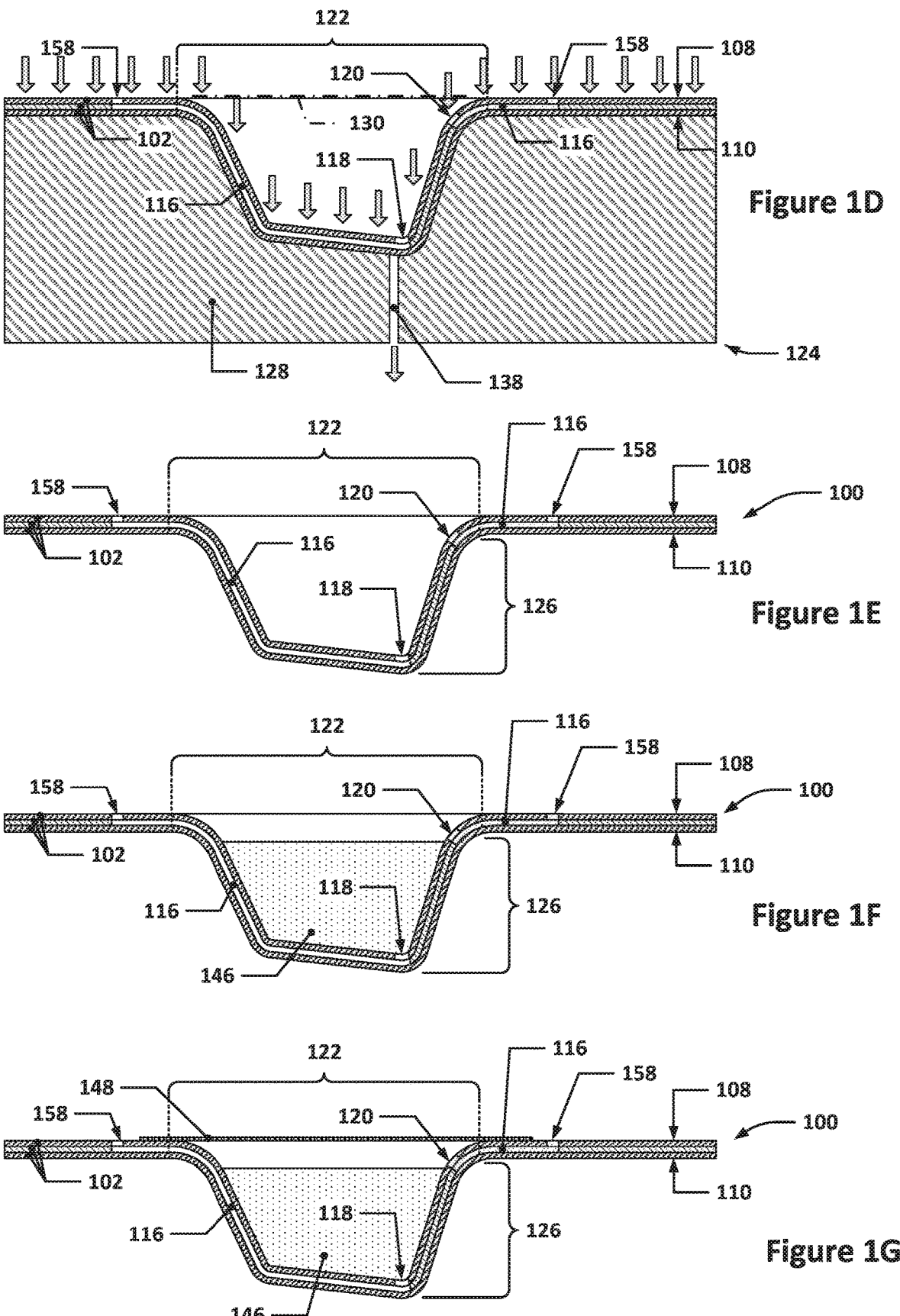

Once the laminated microfluidic structure 100 has been thermoformed, the thermoformed laminated microfluidic structure 100 may be prepared with a reagent 146, e.g., a predetermined amount of the reagent 146 may be delivered to the well 126, as shown in FIG. 1F. Once the reagent has been delivered to the well 126, a seal 148 may be applied to the undeformed first major surface 108 surrounding the well 126, thereby preventing the reagent from exiting the well 126 except through one of the channels 116. Reagents that may be housed in the well 126 may include, for example, a variety of different liquids that may be used in an analysis process, including, for example, buffer solutions, wash solutions, solvents, indicators, etc. It will be understood that "reagents," as the term is used herein, is intended to include substances that are intended to react when combined with other substances as well as substances that are intended not to react when combined with other substances. For example, a reagent, as the term is used herein, may include a non-reactive carrier solution that is selected to dilute another reagent without reacting with it. In some instances, reagents may include dried materials, e.g., reagents in the form of a dry powder or a lyophilized reagent, that may be housed in a well and then reconstituted through the addition of a liquid prior to being transported from the well.

It will be appreciated that the vent port 120 and the channel 116 fluidically connected thereto may be provided to allow for easier aspiration of reagent from the well 126—when reagent is removed from the well 126, the seal 148 may prevent equalization of pressure within the well 126. However, if the vent port 120 is included and the channel 116 fluidically connected thereto is in fluidic communication with the ambient environment (or similar environment), this may allow for such pressure equalization to occur. In fact, in some implementations, the well 126 may be sealed before the reagent 146 is loaded into it, and the reagent 146 may be delivered to the well through either the sipper port 118 or the vent port 120. In some instances, the vent port 120 may be used as a port to deliver pressurized air or other fluid into the well 126 to push fluid from the well 126 through the sipper port 118 and, for example, into a fluidic circuit fluidically connected thereto.

In some implementations, however, only the sipper port 118 may be provided in such a structure, with the vent port 120 and associated channel 116 being omitted. In some such implementations, the seal 148 may be punctured prior to use, e.g., through actions of a puncture mechanism in an analysis instrument or through manual actions performed by an operator, to provide a vent path. In yet other implementations, the seal 148 may be made of an elastomeric material, allowing it to deform into the well 126 when pressure is reduced in the well 126 through withdrawal of the reactant within the well 126.

In some implementations, the sipper port may be positioned in a location such that it is offset or spaced away from the first reference plane 130 in a direction perpendicular to the first reference plane 130 by a distance of between 90% and 100% of the distance between the first reference plane and a portion of the of the first major surface within the first region that is furthest from the first reference plane 130. Put another way, the sipper port may be positioned at the "bottom" of the well, like the drain in a sink.

The channels 116 may, in some implementations, be equipped with valves or frangible seals to allow the reagent 146 to be completely sealed within the well 126 until the laminated microfluidic structure 100 is in use.

FIGS. 2A through 2D depict an alternative thermoforming apparatus and technique for thermoforming a laminated microfluidic structure 200. The elements in FIGS. 2A through 2D are similar in nature to those discussed previously with respect to FIGS. 1A through 1G; the descriptions of elements referenced in FIGS. 1A through 1G with callout numbers having the same last two digits as items in FIGS. 2A through 2D may be assumed to be applicable to those counterpart elements in FIGS. 2A through 2D.

Figures 2A, 2B, 2C, 2D:
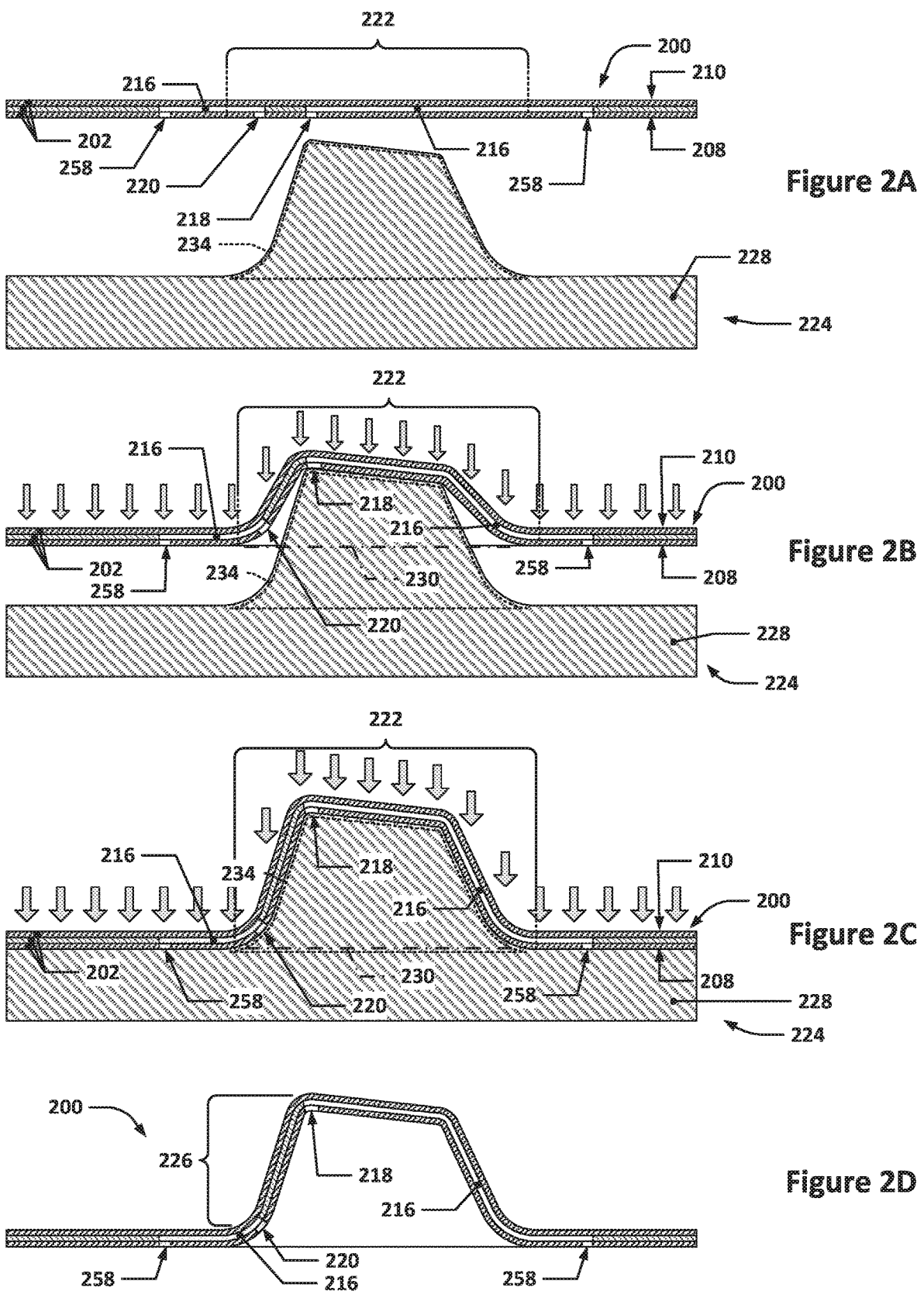
FIGS. 2A through 2D depict an alternative thermoforming apparatus and technique for thermoforming a laminated microfluidic structure.

In FIG. 2A, a laminated microfluidic structure 200 with multiple layers 202 is positioned over a mold 228 of a thermoforming apparatus 224 such that a first region 222 of the laminated microfluidic structure 200 is aligned with a protrusion 234 in the mold 228 when viewed along a direction perpendicular to the layers 202; the laminated microfluidic structure 200, like the laminated microfluidic structure 100, has a first major surface 208 and a second major surface 210. As with the laminated microfluidic structure 100, the laminated microfluidic structure 200 includes channels 216 that fluidically connect a sipper port 218 and vent port 220 located within the first region 222 with ports 258 located outside of the first region 222 or other microfluidic structures, such as valves, pumps, vias, etc. located outside of the first region 222.

Unlike the mold 128, the mold 228 has a protrusion 234 instead of a recess 136, which causes the laminated microfluidic structure 200 to bulge upwards from reference plane 230, as shown in FIGS. 2B and 2C, when the first region 222 of the laminated microfluidic structure 200 (when it is within the temperature range for thermoforming) is brought into contact with the mold 228. The resulting thermoformed laminated microfluidic structure 200 with well 226, as shown in FIG. 2D, may then be handled in a manner similar to that of the laminated microfluidic structure 100 in FIGS. 1F and 1G.

FIGS. 3A through 3D depict another alternative thermoforming apparatus and technique for thermoforming a laminated microfluidic structure 300 having multiple layers 302. The elements in FIGS. 3A through 3D are similar in nature to those discussed previously with respect to FIGS. 1A through 1G and FIGS. 2A through 2D; the descriptions of elements referenced in FIGS. 1A through 1G or 2A through 2D with callout numbers having the same last two digits as items in FIGS. 3A through 3D may be assumed to be applicable to those counterpart elements in FIGS. 3A through 3D.

In this thermoforming technique, the laminated microfluidic structure 300, which may have a first major surface 308 and a second major surface 310, may be positioned in a thermoforming apparatus 324 that includes a first mold 342 and a second mold 34. The laminated microfluidic structure 300 may, similar to the laminated microfluidic structure 100, have channels 316 that fluidically connect a sipper port 318 and a vent port 320 within a first region 322 with ports 358 or other microfluidic features outside of the first region 322. The first mold 342 may include a protrusion 334 and the second mold 344 may include a corresponding recess 336; the recess 336 and the protrusion 334 may be sized such that the first mold 342 and the second mold 344 can be positioned relative to each other such that a substantially constant-sized or near-constant-sized gap exists between the facing surfaces of the first mold 342 and the second mold 344. Put another way, the protrusion 334 and the recess 336 may generally be complementary in shape so that the protrusion aligns with and nestles into the recess, leaving sufficient gap to accommodate the laminated microfluidic structure therebetween, when the first mold 342 and the second mold 344 are mated together.

Figure 3A:
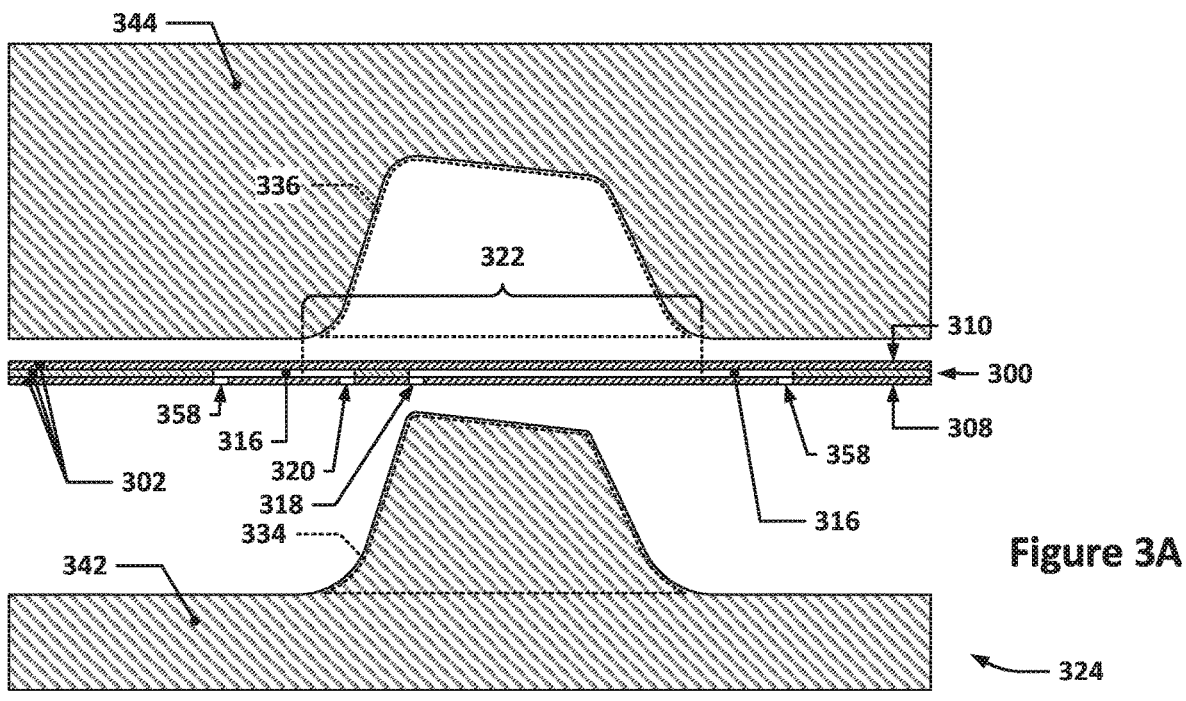
FIGS. 3A through 3D depict another alternative thermoforming apparatus and technique for thermoforming a laminated microfluidic structure.
Figure 3B:
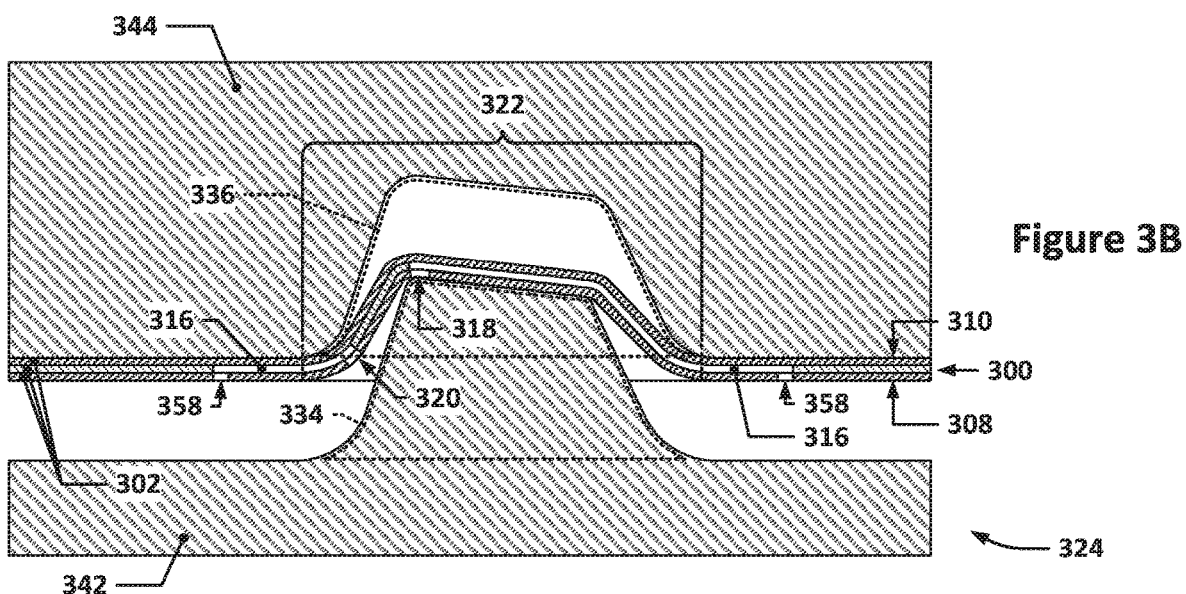
Figure 3C:
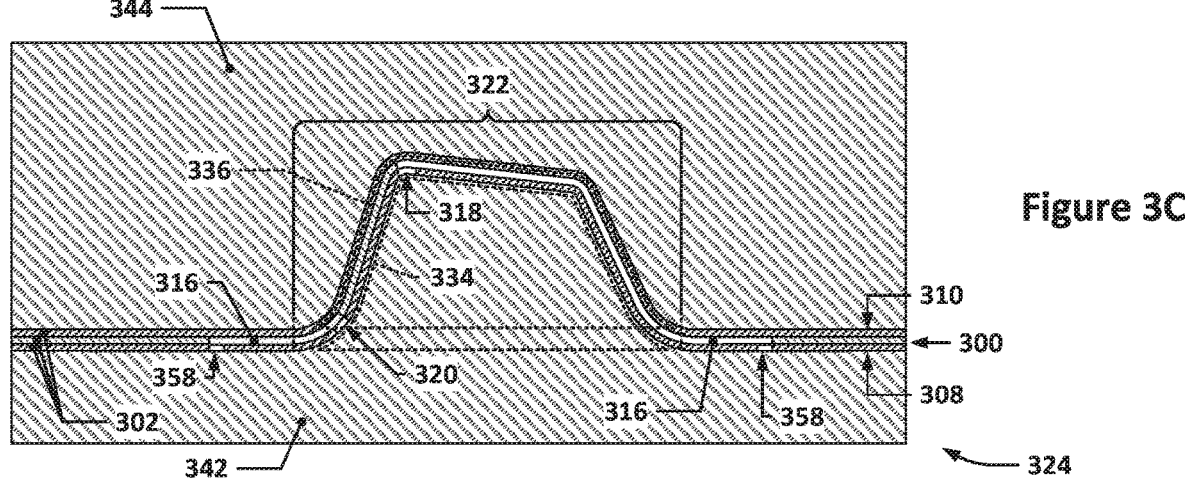
Figure 3D:
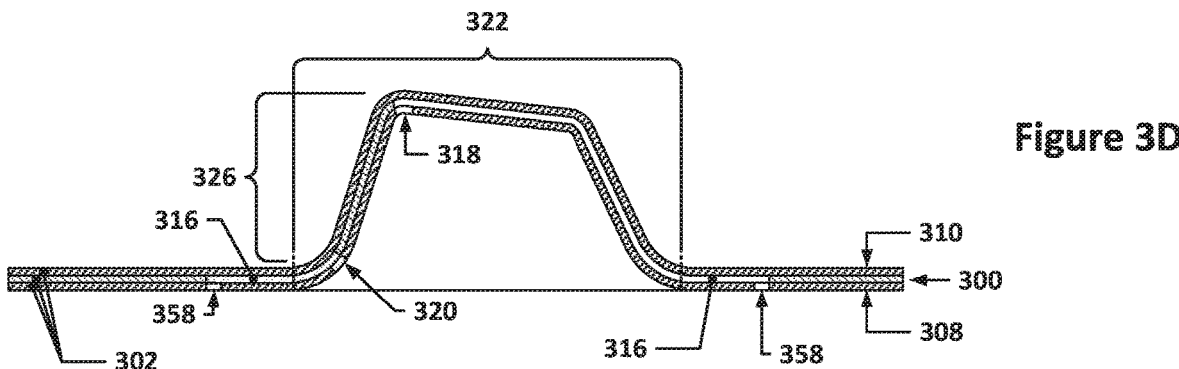

When the laminated microfluidic structure 300 is brought to a suitable thermoforming temperature, the first mold 342 and/or the second mold 344 may be moved relative to each other with the laminated microfluidic structure 300 interposed therebetween and positioned such that the first region aligns with the recess 336 and the protrusion 334 when viewed along an axis perpendicular to a reference plane similar to the reference planes discussed earlier, e.g., a reference plane coincident with portions of the first major surface 308 that will remain undeformed. The resulting contact between the laminated microfluidic structure 300 and the first mold 342 and the second mold 344 then causes a first region 322 of the laminated microfluidic structure 300 to distend, as shown in FIGS. 3B and 3C; the resulting deformed laminated microfluidic structure 300 having well 326, as shown in FIG. 3D, may be handled in a manner similar to that of the laminated microfluidic structure 100 in FIGS. 1F through 1G. It will be understood that the relative orientations/positions of the first mold 342 and the second mold 344 may be reversed in some implementations, e.g., the first mold 342 may be above the second mold 344.

Generally speaking, thermoforming processes suitable for use in creating the microfluidic structures discussed herein may utilize one or more thermoforming molds in order to control the thermoforming operation; ultimately, whatever thermoforming process is used may involve heating the laminated microfluidic structure to a temperature above the glass transition temperature of the polymeric material(s) used in the laminated microfluidic structure followed by the application of a first pressure field to the first major surface over the region to be distended, and a second pressure field to the second major surface over that same region (these pressure fields may also be applied to the entire first and second major surfaces, respectively). The first pressure field may, on average, be greater than the second pressure field when evaluated across the region to be distended, which may cause a pressure differential in the region in question that causes it to distend as equilibrium between the two pressure fields is sought. Such pressure fields may result from the application of a pressurized fluid such as air (or lowering the pressure of a fluid such as air) that is in contact with the laminated microfluidic structure; such pressure fields may also or alternatively result from the application of force through mechanical contact, e.g., due to the force applied to the contact area between a mold protrusion, for example, and the laminated microfluidic structure.

Figure 4:
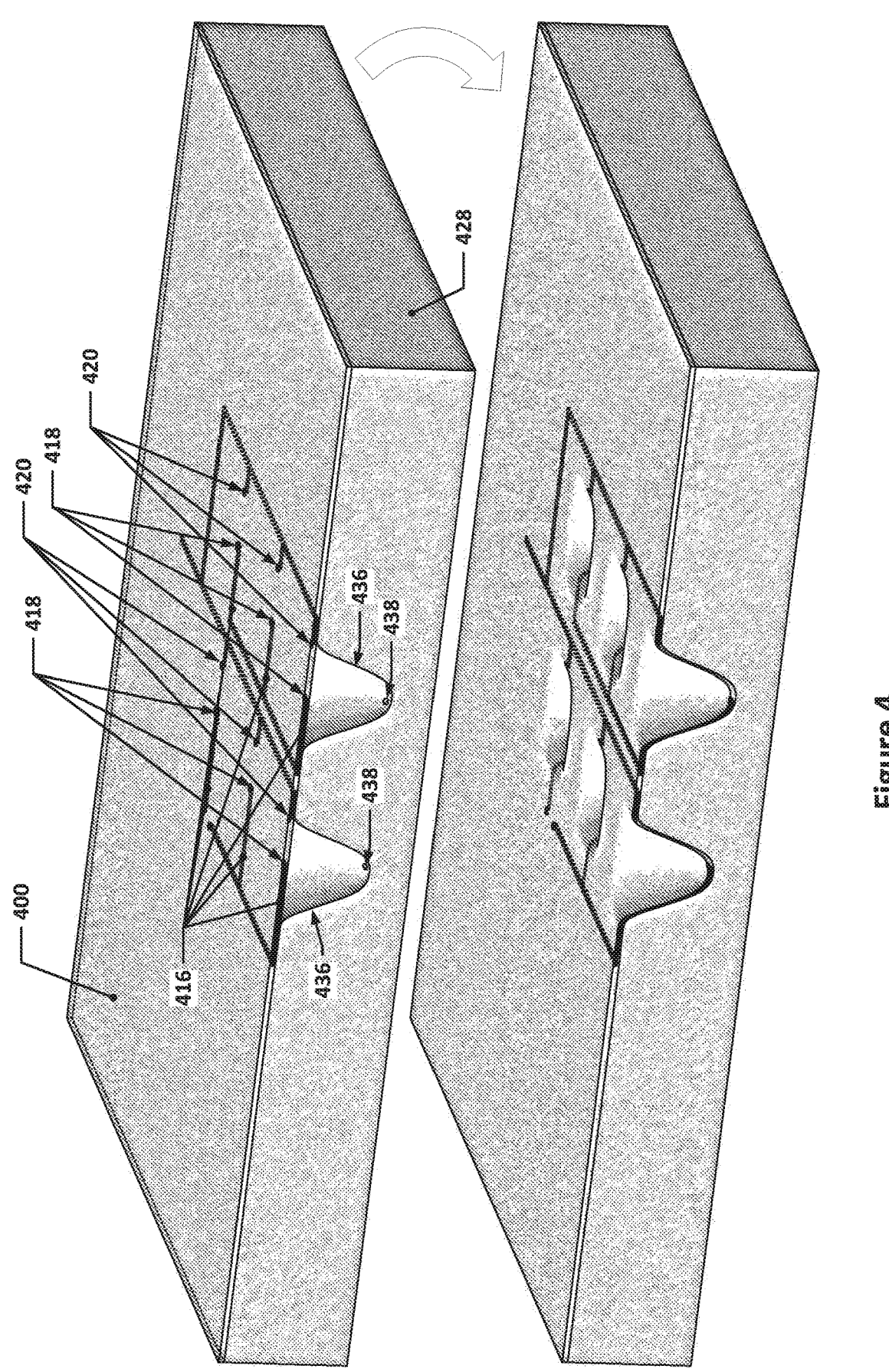
FIG. 4 depicts a perspective cutaway view of an example thermoforming apparatus that may be used for thermoforming six separate wells in a laminated microfluidic structure.

FIG. 4 depicts a perspective cutaway view of an example thermoforming apparatus that may be used for thermoforming six separate wells in a laminated microfluidic structure 400. The laminated microfluidic structure 400, in this example, includes sipper ports 418 and vent ports 420, as well as a plurality of channels 416. The thermoforming apparatus in this example includes a mold 428 with recesses 436. Each recess 436 in the mold 428 includes a vacuum port 438 to allow for a negative pressure to be drawn on each recess 436 or for pressure relief from each recess 436. When the laminated microfluidic structure 400 is brought to an appropriate thermoforming temperature, various regions of the laminated microfluidic structure 400 may be distended into the recesses 436, e.g., by applying a positive pressure to the upper surface of the laminated microfluidic structure 400 or by drawing a vacuum on the vacuum ports 438. As can be seen, it is possible to create multiple deformed regions, e.g., wells, in the laminated microfluidic structure 400 simultaneously. The upper portion of the Figure shows such an arrangement prior to thermoforming, and the lower portion of the Figure shows such an arrangement after thermoforming (but before the resulting thermoformed part is removed). This technique is similar to that discussed with regard to FIGS. 1A through 1D.

Figure 5:
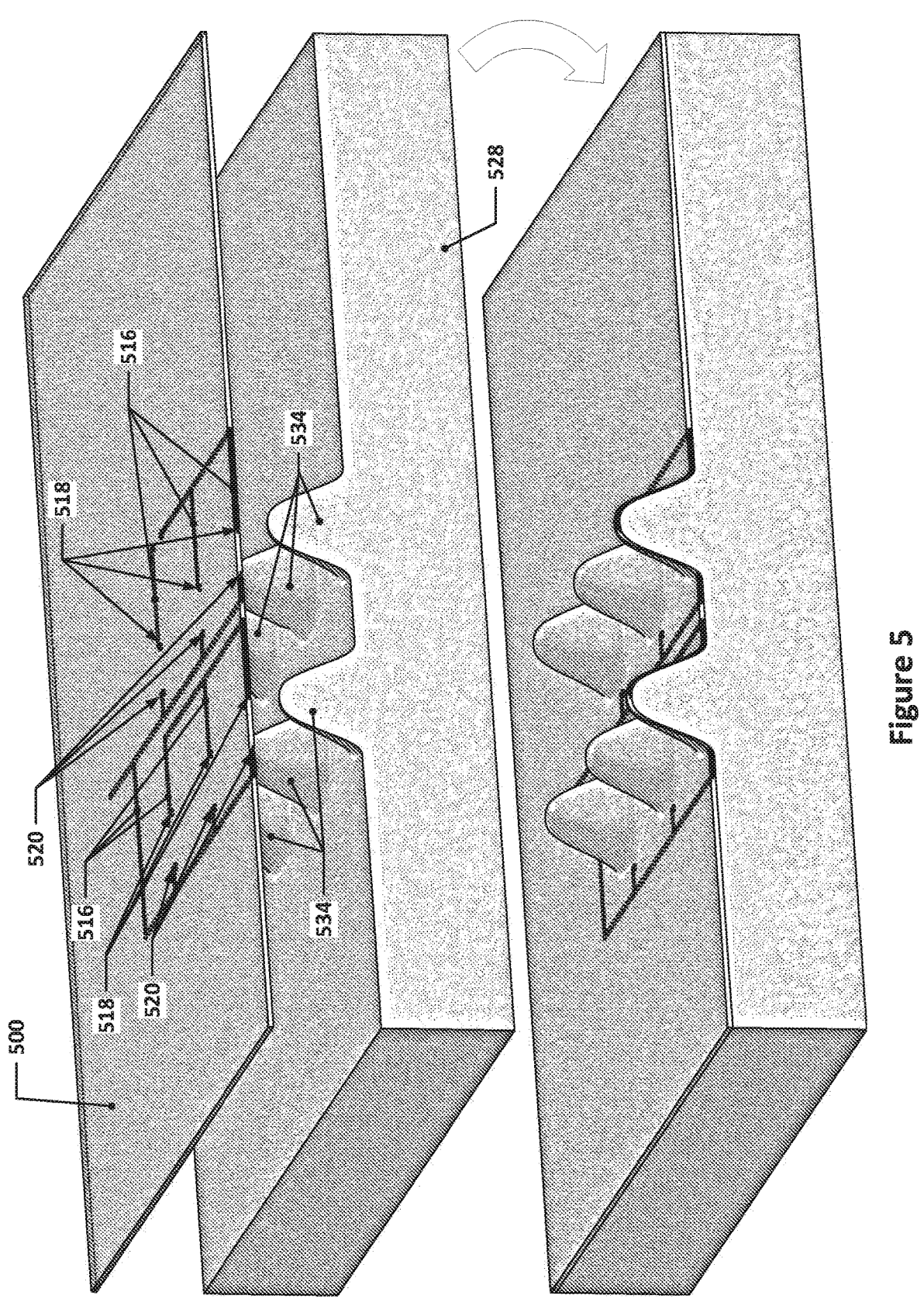
FIG. 5 depicts a perspective cutaway view of another example thermoforming apparatus that may be used for thermoforming six separate wells in a laminated microfluidic structure.

FIG. 5 depicts a perspective cutaway view of another example thermoforming apparatus that may be used for thermoforming six separate wells in a laminated microfluidic structure 500. The laminated microfluidic structure 500, in this example, includes sipper ports 518 and vent ports 520, as well as a plurality of channels 516. The thermoforming apparatus in this example includes a mold 528 with protrusions 536. When the laminated microfluidic structure 500 is brought to an appropriate thermoforming temperature, various regions of the laminated microfluidic structure 500 may be distended by drawing them over protrusions 534. As can be seen, it is possible to create multiple deformed regions, e.g., wells, in the laminated microfluidic structure 500 simultaneously. The upper portion of the Figure shows such an arrangement prior to thermoforming, and the lower portion of the Figure shows such an arrangement after thermoforming (but before the resulting thermoformed part is removed). This technique is similar to that discussed with regard to FIGS. 2A through 2D.

Figure 6:
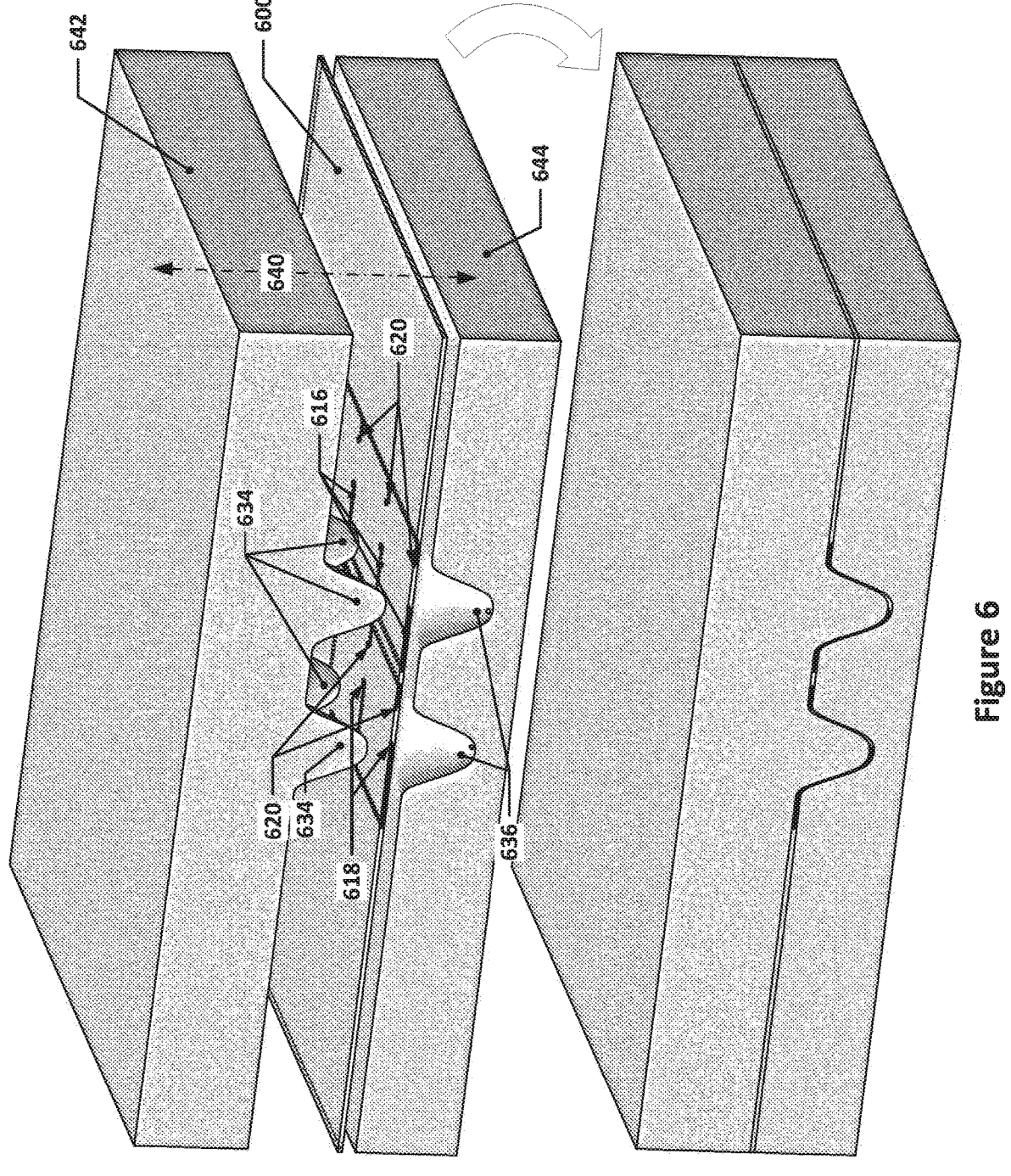
FIG. 6 depicts a perspective cutaway view of another example thermoforming apparatus that may be used for thermoforming six separate wells in a laminated microfluidic structure.

FIG. 6 depicts a perspective cutaway view of another example thermoforming apparatus that may be used for thermoforming six separate wells in a laminated microfluidic structure 600. The laminated microfluidic structure 600, in this example, includes sipper ports 618 and vent ports 620, as well as a plurality of channels 616. The thermoforming apparatus in this example includes both a first mold 642 with protrusions 634 and a second mold 644 with recesses 636. When the laminated microfluidic structure 600 is brought to an appropriate thermoforming temperature, various regions of the laminated microfluidic structure 600 may be distended by lightly compressing the laminated microfluidic structure 600 between the first mold 642 and the second mold 644, e.g., by causing one or both of the first mold 642 and the second mold 644 to translate along a first axis 640 relative to the other, causing the protrusions 634 to deform regions of the laminated microfluidic structure 600 into the recesses 636. As can be seen, it is possible to create multiple deformed regions, e.g., wells, in the laminated microfluidic structure 600 simultaneously. The upper portion of the Figure shows such an arrangement prior to thermoforming, and the lower portion of the Figure shows such an arrangement after thermoforming (but before the resulting thermoformed part is removed). This technique is similar to that discussed with regard to FIGS. 3A through 3D.

In some implementations, a thermoforming apparatus may be used in which the mold, or one or both of the molds if multiple molds are used, may include a relief groove or channel on a surface of either the recess or protrusion, or both, as appropriate. Such relief grooves may be positioned and oriented so that the channels within the regions to be deformed are overlaid on the relief grooves during thermoforming operations. The relief grooves may be generally be the same width, or slightly larger than, the channels with which they are intended to overlap. Such relief grooves may be used to reduce the amount of force or pressure that may be applied to the laminated microfluidic structure in the areas in the immediate vicinity of the channels; this may help reduce the extent to which the channels may deform through the thickness of the laminated microfluidic structure, thereby helping preserve their original cross-sectional geometry and reducing the chance of a blockage or inadvertent channel collapse.

Figure 7:
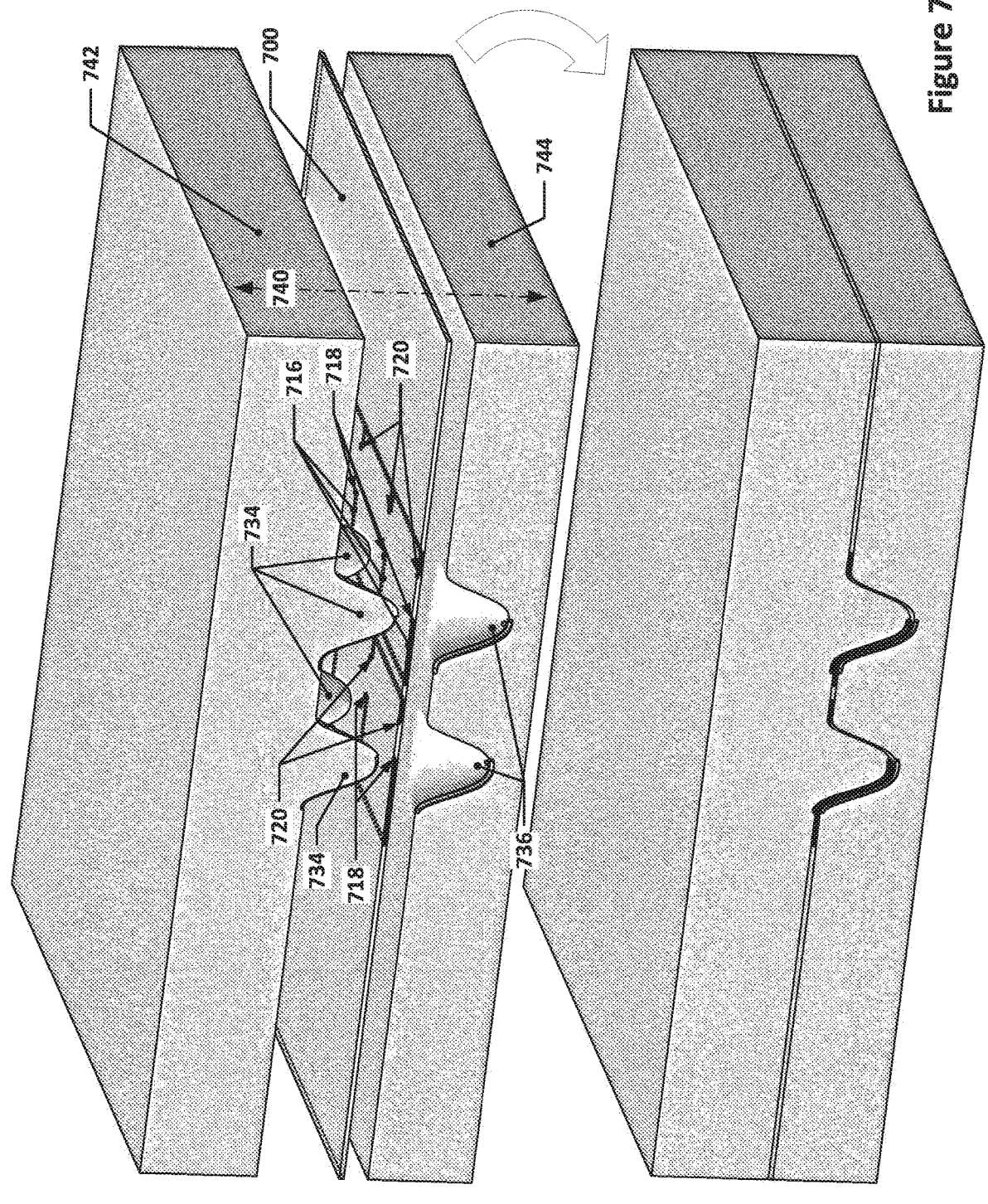
FIG. 7 is similar to FIG. 6, except that the first mold and the second mold include relief grooves in the recesses and the protrusions.
Figure 9:
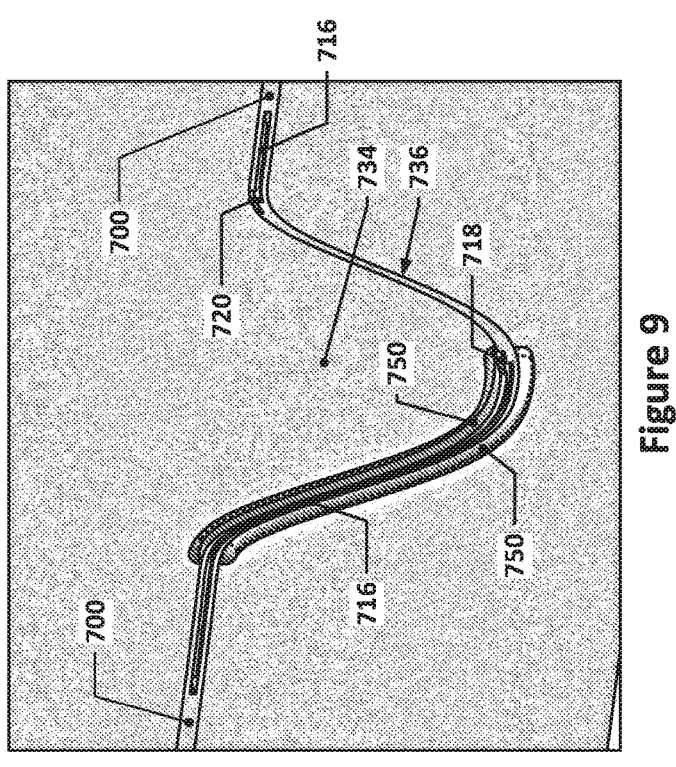
FIGS. 8 and 9 are detail views of one of the recesses and protrusions of FIG. 7 prior to thermoforming and subsequent to thermoforming, respectively.
Figure 8:
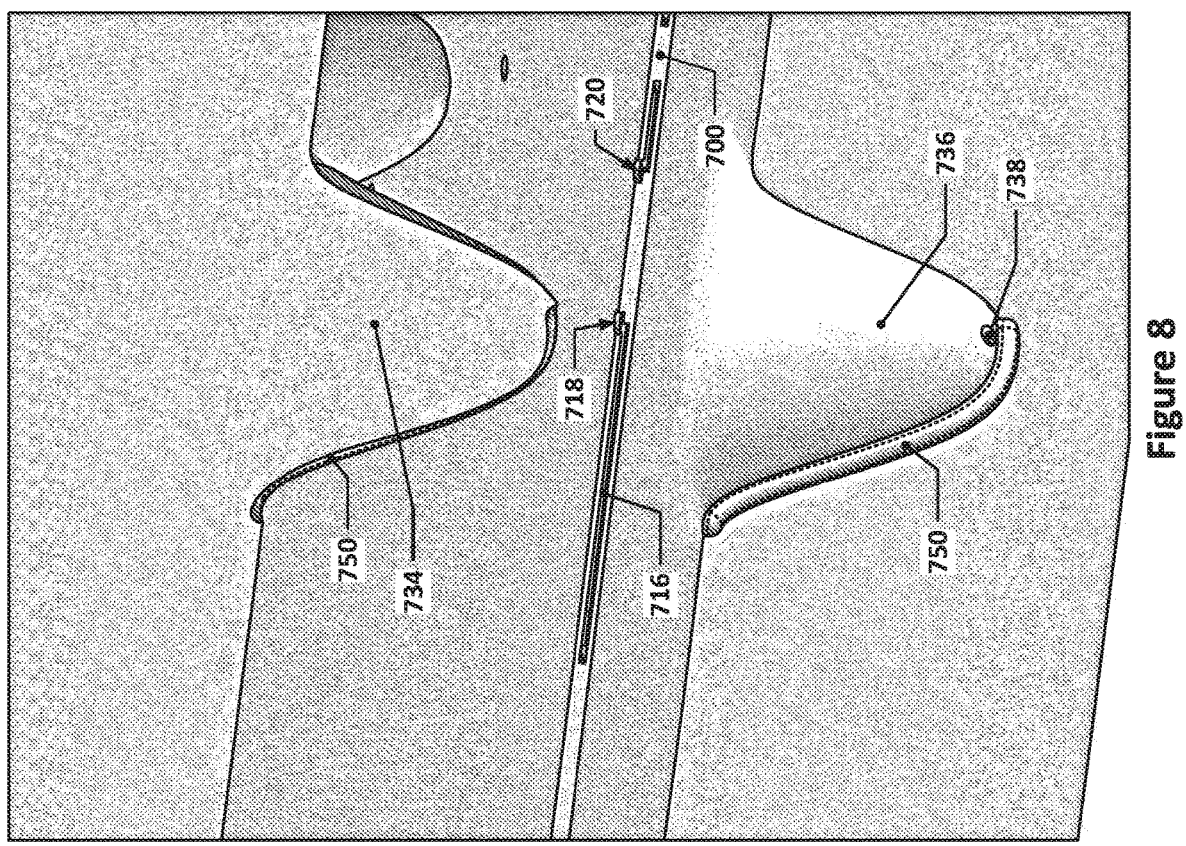

FIG. 7 is similar to FIG. 6, except that the first mold 742 and the second mold 744 include relief grooves 750 (shown in FIGS. 8 and 9) in the recesses 736 and the protrusions 734, as discussed above. FIGS. 8 and 9 are detail views of one of the recesses 736 and protrusions 734 of FIG. 7 prior to thermoforming and subsequent to thermoforming, respectively. As can be seen, the relief grooves 750 are provided on both the protrusion 734 and the recess 736, although in other similar implementations, only a single relief groove 750 may be provided, e.g., on the protrusion 734 or on the recess 736. The laminated microfluidic structure 700 in this example includes a number of sipper ports 718 and vent ports 720 that are fluidically connected to channels 716 (or other channels); the channels 716 within the regions to be distended may overlay the relief grooves 750 when viewed along the first axis 740.

The relief grooves, if used, may, as noted earlier, be approximately the same width as the channels with which they are aligned. In some implementations, the relief grooves may be between 100% and 200% of the width of the channels with which they correspond. The depths of the relief grooves may, for example, be 0.1 mm, inclusive, to 2 mm, inclusive.

As discussed above, there are multiple techniques that may be used to form a laminated microfluidic structure having integrated wells with sipper ports located in the bottom of the well and channels embedded within the walls of the wells. In addition to the thermoforming techniques discussed above in which a substantially planar laminated microfluidic structure is thermoformed to produce the wells, other techniques may involve forming two or more layers to have matching well structures and then bonding the two or more layers together after the well structures are formed to produce a similar structure.

Figures 10A, 10B, 10C, 10D, 10E:
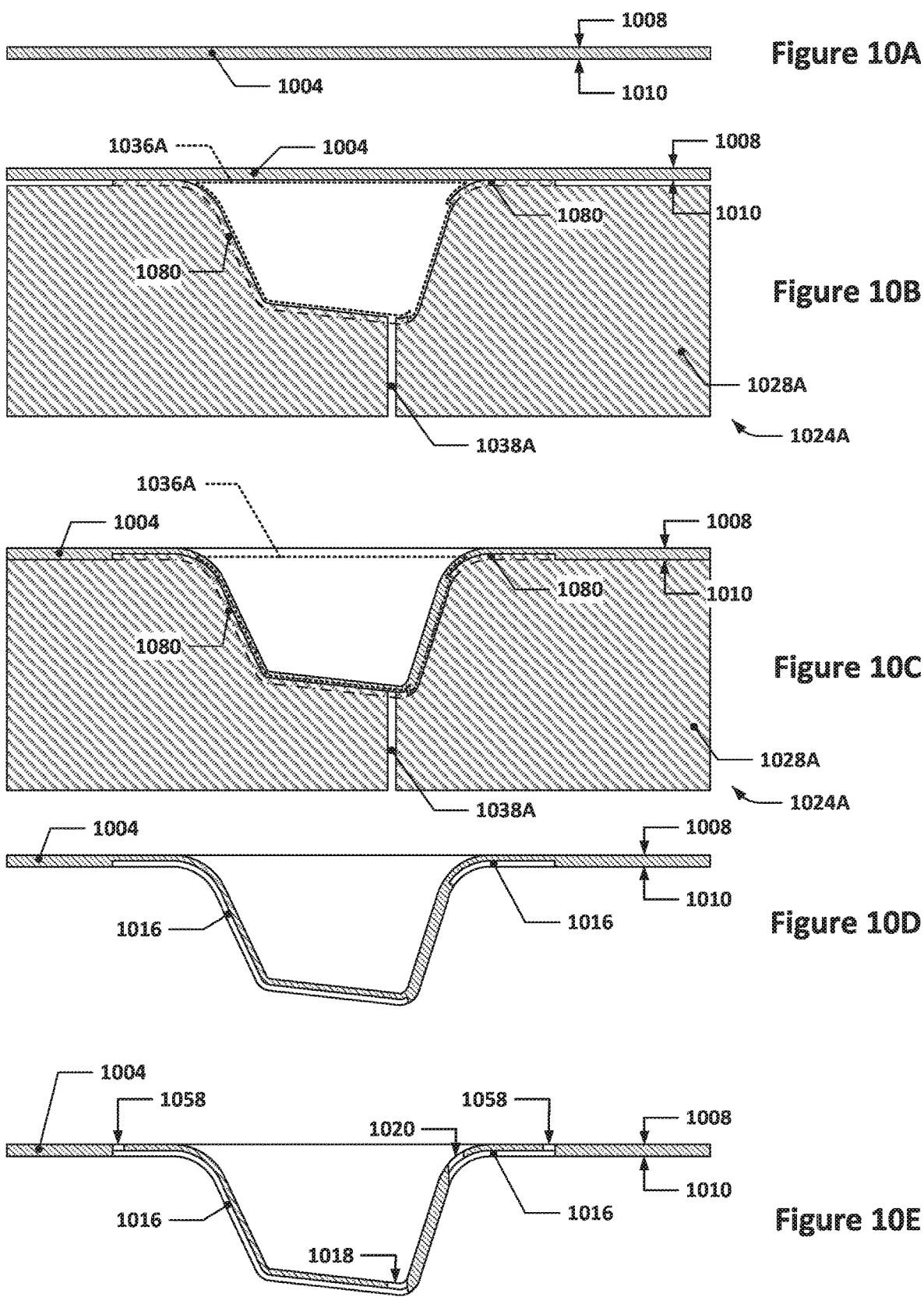

FIGS. 10A through 10J depict various stages in such a manufacturing process. In FIG. 10A, a first layer 1004 of polymeric material may be provided. The first layer 1004 may have a first major surface 1008 and a second major surface 1010 opposite the first major surface 1008. The second major surface 1010 may be placed against a mold 1028A of a thermoforming apparatus 1024A, as shown in FIG. 10B. The mold 1028A may include a vacuum port 1038A to allow a negative pressure to be drawn on the recess 1036A of the mold 1028A, or to allow pressurized air to escape during thermoforming of the first layer 1004. The mold 1028A in this case includes two debossing features 1080, which may be raised portions that may, when pressed into the first layer 1004 while the first layer 1004 is being deformed, imprint the contacting second major surface 1010 to form channels 1016, as shown in FIG. 10C. Put another way, the debossing features 1080 may be proud of the recessed surface that forms the majority of the recess 1036. The resulting thermoformed first layer 1004 is shown in FIG. 10D and, as can be seen, includes channels 1016 which, at this point, are open grooves or trenches in the second major surface 1010. After the channels 1016 have been formed, a sipper port 1018, vent port 1020, and ports 1058 may be formed in the first layer 1004, e.g., by drilling, laser cutting, or die cutting, and as shown in FIG. 10E. The various ports may also, in some implementations, be created prior to the thermoforming process and/or during the thermoforming process (for example, the debossing features 1080 may include raised mesas at either end that may puncture through the first layer 1004 during the thermoforming process. It will be understood that in some implementations, a mold with a protrusion may have a debossing feature 1080 to allow a channel to be formed in, for example, the second layer 1006 instead (or additionally).

Figure 10I:
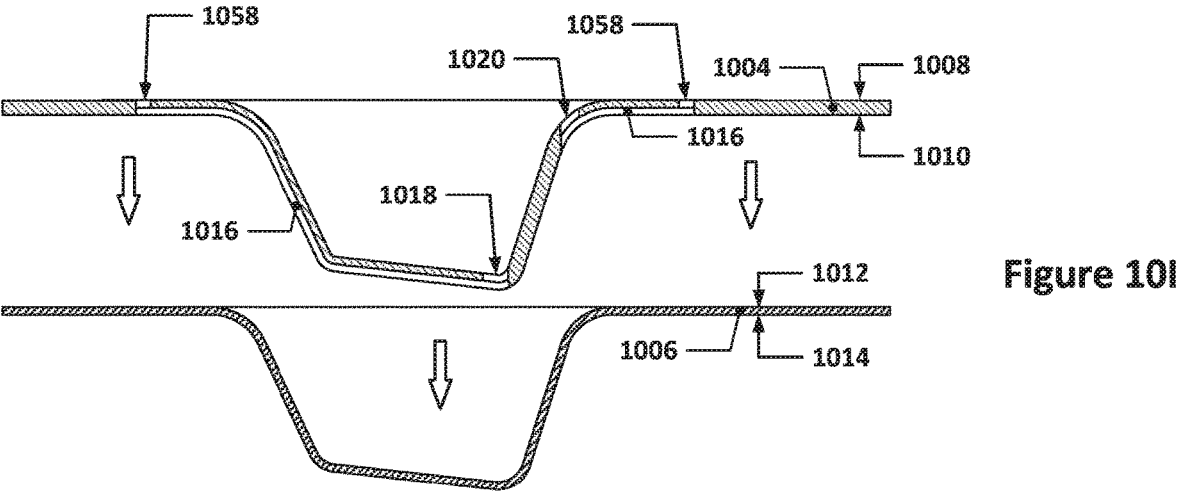
Figure 10J:
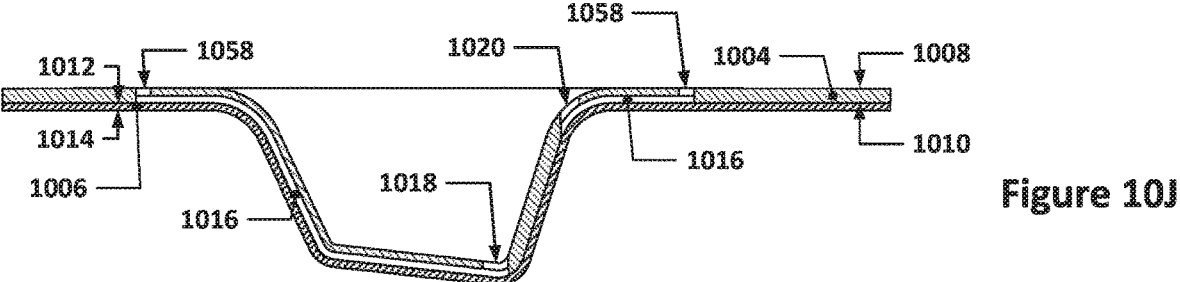

In FIG. 10F, a second layer 1006 of polymeric material with a third major surface 1012 and a fourth major surface 1014 may be provided. The fourth major surface 1014 may be placed against a mold 1028B of a thermoforming apparatus 1024B, as shown in FIG. 10G, and then thermoformed to draw the second layer 1006 into the recess 1036B, e.g., by drawing a negative pressure on the vacuum port 1038B, as shown in FIG. 10H. The second layer 1006 may then be removed from the thermoforming apparatus 1024B and the thermoformed first layer 1004 then nested into the thermoformed second layer 1006, as shown in FIG. 10I and the two layers bonded together to form a laminated microfluidic structure 1000, as shown in FIG. 10J. Such bonding may, for example, be performed with adhesives such as UV-cured adhesives or thermally cured adhesives, with solvent bonding, with laser welding, or any other suitable bonding technique. It will also be understood that the first layer 1004 and the second layer 1006 may be manufactured according to other techniques instead of the thermoforming techniques discussed above. For example, the first layer 1004 and/or the second layer 1006 may be manufactured using injection molding techniques, e.g., the first layer 1004 and/or the second layer 1006 may be formed in an injection molding machine, in which case no subsequent thermoforming operations need to be performed, as the first layer 1004 and/or the second layer 1006 may be formed with the wells already in place.

Generally speaking, regardless of how the two layers of material are formed, the first layer may include a first major surface with a concave shape in a first region of the first layer and a second major surface with a convex shape generally matching the concave shape in the first major surface in location, shape, and size (accounting for the thickness of the first layer, however). Similarly, the second layer may include a third major surface with a concave shape in a second region of the second layer and a fourth major surface with a convex shape generally matching the concave shape in the third major surface in location, shape, and size (accounting for the thickness of the second layer, however). One or more sipper ports may be provided through the first layer, either before, during, or after the concave/convex shapes are formed, and one or more channels, each leading from one of the one or more sipper ports to a location outside of the first/second regions, may be provided in the second and/or third surfaces—the two layers may then be bonded together with the convex shape of the second major surface nestled into the concave shape of the third major surface, as discussed above.

As discussed earlier, in some implementations, a laminated microfluidic structure may be incorporated in a co-molded or overmolded structure. For example, a laminated microfluidic structure (either with thermoformed or injection-molded wells or without) may be inserted into a mold cavity of an injection molding machine to act as the preexisting part, and then molten polymeric material injection-molded around the laminated microfluidic structure or portions thereof.

Figure 11:
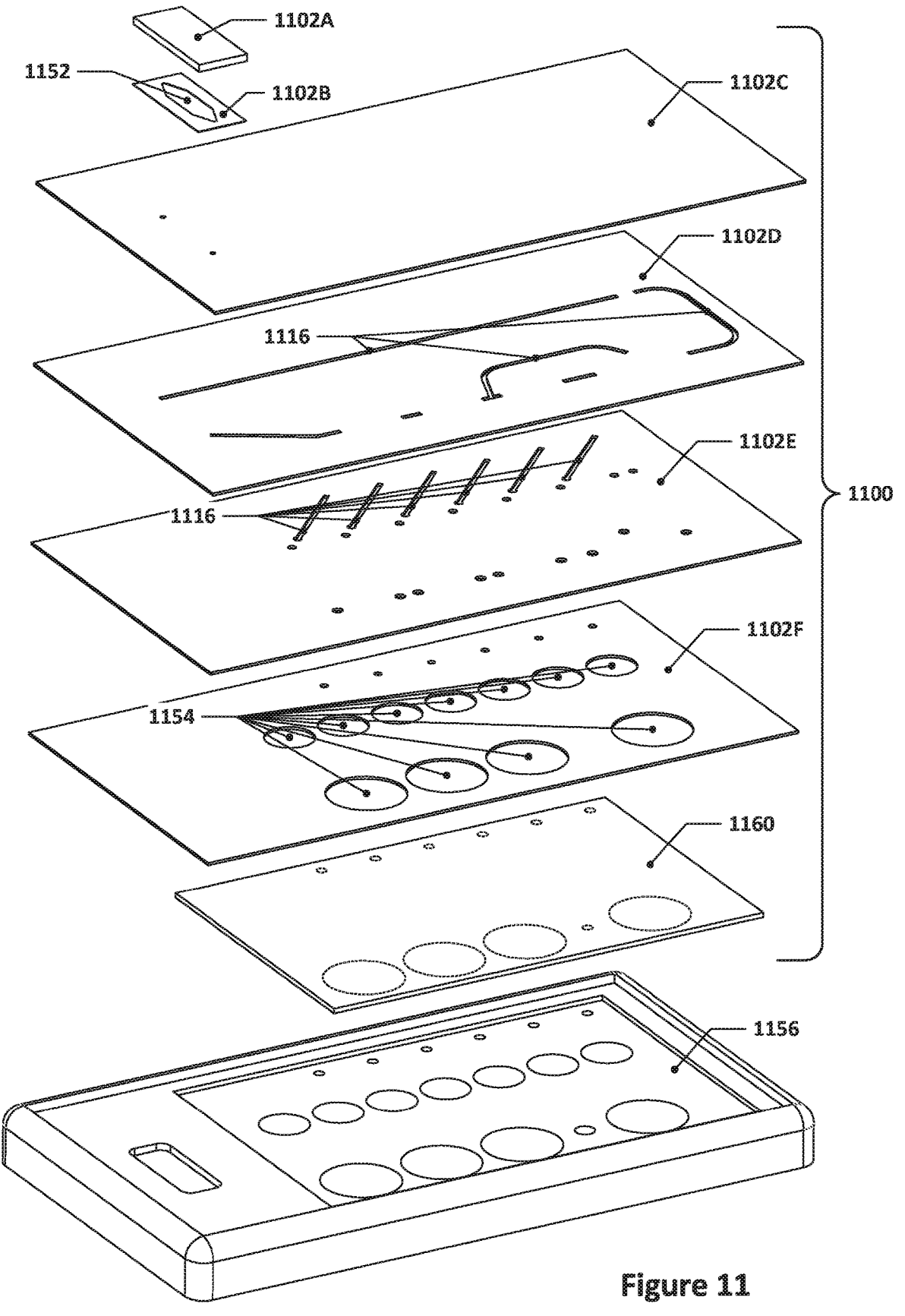
FIG. 11 depicts an exploded view of an example of a co-molded or overmolded microfluidic cartridge.

FIG. 11 depicts an exploded view of an example of a co-molded or overmolded microfluidic cartridge. In FIG. 11, layers 1102A-1102F may be stacked together and bonded to one another to form a laminated microfluidic structure 1100 that has, for example, channels 1116, a flowcell 1152, and a plurality of diaphragm recesses 1154 in it. The laminated microfluidic structure may also include a membrane 1160 of an elastomeric material, such as silicone or thermoplastic elastomer, which may be pressurized over the regions indicated by the dotted circles to cause those regions to temporarily distend into a corresponding diaphragm recess 1154, which may act to prevent fluids from flowing through such diaphragm recesses 1154 or to force fluid already in the diaphragm recesses 1154. Such diaphragm recesses 1154 may, for example, be part of a microfluidic pump when three or more of such structures are chained together in series and then actuated in a particular order, e.g., pressurizing the second and third diaphragms in the series to "close" them, depressurizing the first diaphragm in the series to "open" it, depressurizing the second diaphragm to open it and draw fluid into the corresponding diaphragm recess, pressurizing the first diaphragm to close it, depressurizing the third diaphragm valve to open it, pressurizing the second diaphragm to close it and force the fluid therein to be expelled into the diaphragm recess for the third diaphragm, and then pressurizing the third diaphragm to force the fluid therein to be expelled out of the third diaphragm's diaphragm recess. This sequence of events may then be repeated multiple times to pump fluid through the chain of diaphragm valves in a more or less continuous manner.

Figure 12:
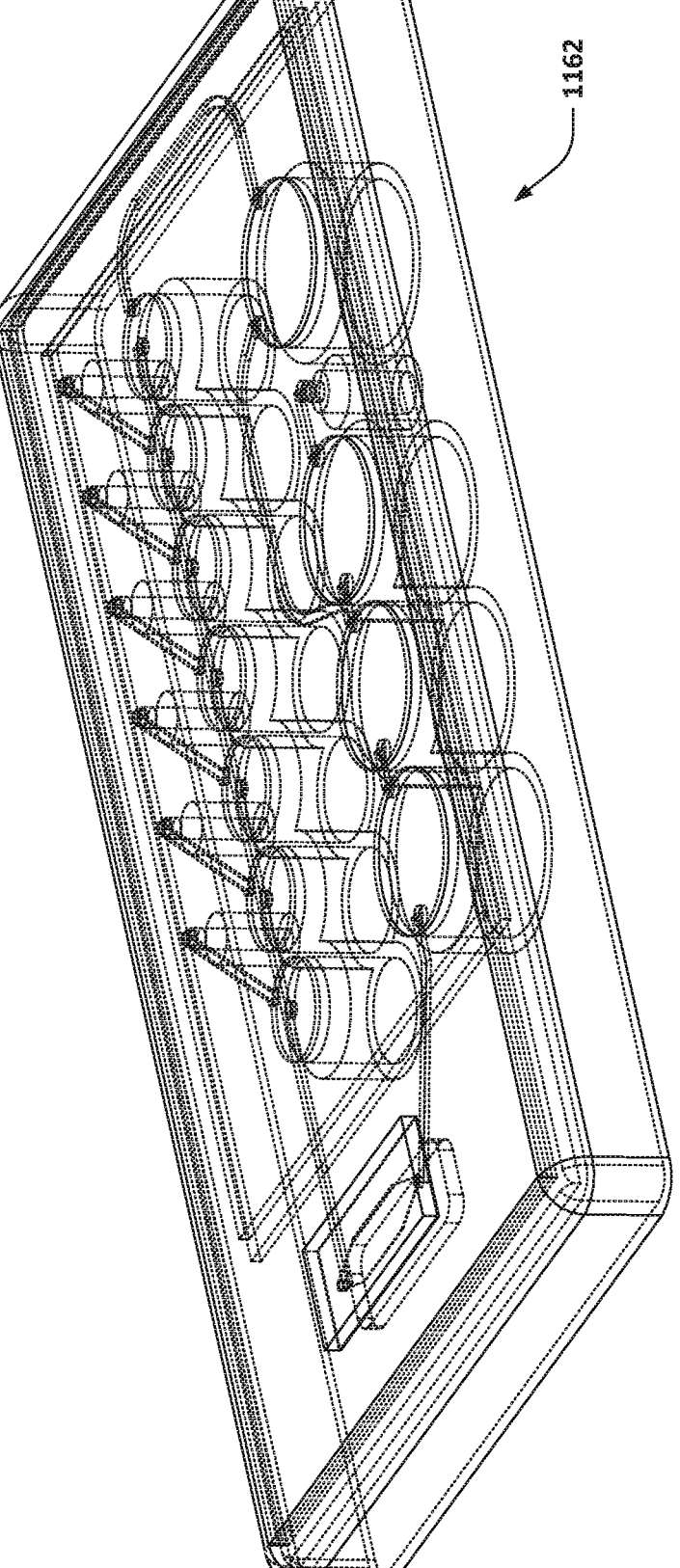
FIG. 12 depicts the cartridge of FIG. 11 in an assembled form.

The laminated microfluidic structure 1100 may be, in effect, fused to and/or embedded into a housing 1156 in an overmolding or co-molding process to provide a single, integrated cartridge 1162, as shown in FIG. 12. In some alternative techniques, an injection-molded housing may be made without co-molding or overmolding laminated microfluidic structure, e.g., using a single-shot injection molding process. In such techniques, a laminated microfluidic structure may be subsequently fused to the housing using, for example, during a thermoforming process. For example, a laminated microfluidic structure may be subjected to thermoforming operations to produce reagent wells, as discussed earlier herein. The thermoformed laminated microfluidic structure may then, while still hot from the thermoforming process, be pressed against a surface of the housing such that the contacting surface fuses to the housing as it cools, thereby molecularly entangling the materials of the two contacting surfaces and creating a liquid-tight seal between the laminated microfluidic structure and the housing. In some such techniques, the housing may also be heated to a similar temperature to help facilitate such thermoforming fusing.

Figures 13A, 13B, 13C, 13D, 13E:
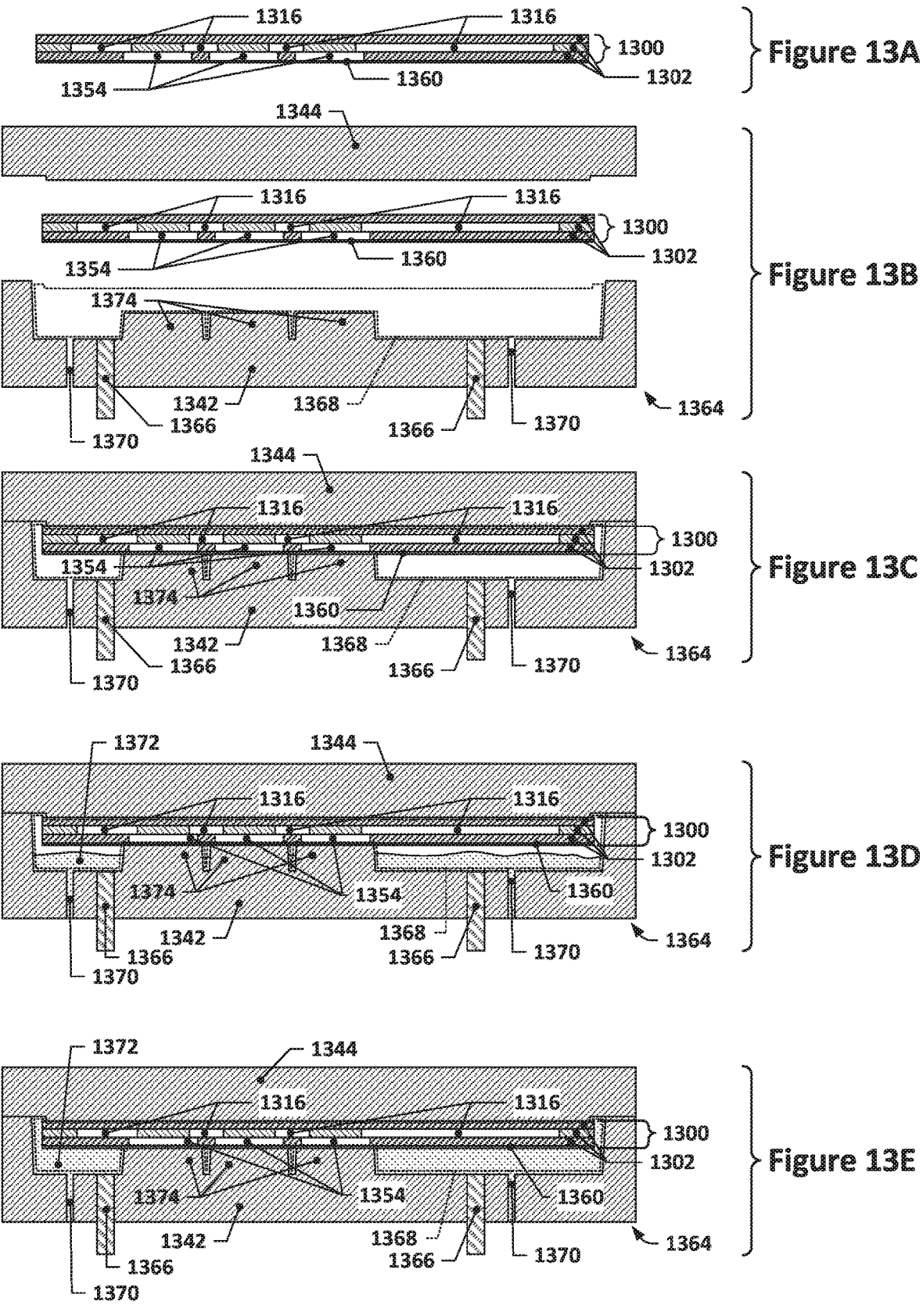
FIGS. 13A through 13H depict various stages in an example overmolding or co-molding process.

FIGS. 13A through 13H depict various stages in an example such overmolding or co-molding process. In FIG. 13A, a laminated microfluidic structure 1300 may be provided. In this example, the laminated microfluidic structure 1300 includes a number of layers 1302, channels 1316, diaphragm recesses 1354, and a membrane 1360 made of an elastomeric material; it will be recognized that other laminated microfluidic structures 1300 may be used as well, including laminated microfluidic structures that do not include membrane 1360 or that have not been thermoformed into reagent wells.

In FIG. 13B, the laminated microfluidic structure 1300 may be placed in the mold cavity 1368 of an injection molding machine mold 1364, which may include a first mold 1342 and a second mold 1344 which, when mated with each other, form the mold cavity 1368. The first mold 1342, in this example, includes a number of protrusions 1374 that may engage with regions of the laminated microfluidic structure 1300 that may need to be kept clear of injection molded plastic, e.g., the regions of the membrane 1360 that overlay the diaphragm recesses 1354 may each be engaged with the top surface of one of the protrusions 1374. The laminated microfluidic structure 1300, in this example, may also engage with the second mold 1344, which may compress the laminated microfluidic structure 1300 into the protrusions 1374, thereby helping ensure that no molten polymeric material is forced into the regions of the laminated microfluidic structure 1100 having the diaphragm recesses 1154 (which would likely cause the membrane 1160 to deform into the diaphragm recesses 1154 and would cause the diaphragm valves located in those regions to no longer function correctly once the molten polymeric material had solidified).

The first mold 1342 in this example also includes injection ports 1370, which may be used to introduce molten polymeric material into the injection molding machine mold 1364 when the first mold 1342 and the second mold 1344 are sealed together; the injection ports 1370 may also or alternatively be located in the second mold 1344. In addition to the injection ports 1370, the first mold 1342 also includes ejector pins 1366, which may be actuated after the injection molding operation is complete and used to eject the cooled, molded part from the first mold 1342.

Figure 13F:
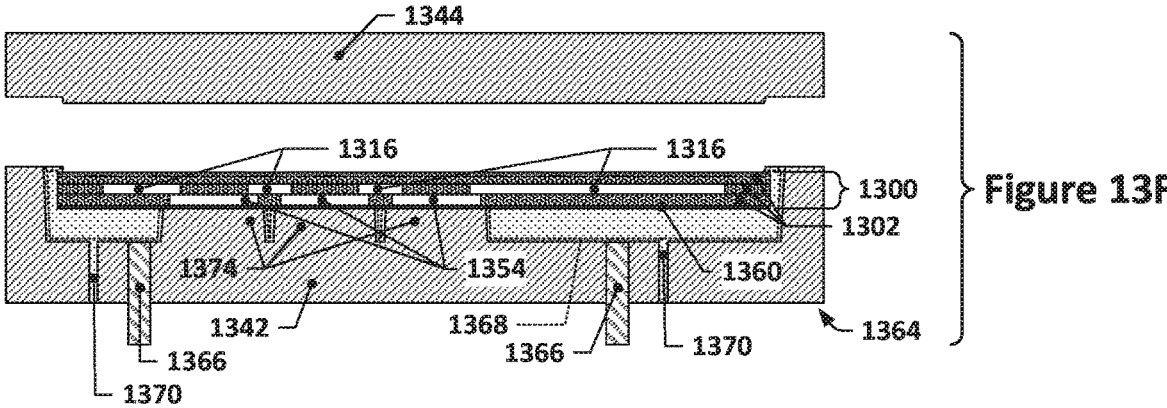
Figure 13G:
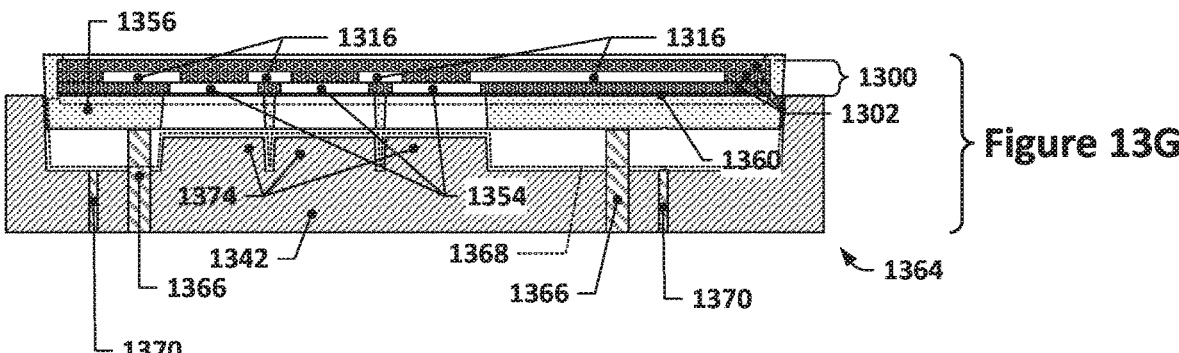

In FIG. 13C, the first mold 1342 and the second mold 1344 have been sealed together with the laminated microfluidic structure 1300 sandwiched between them; in FIGS. 13D and 13E, molten polymeric material has been injected into the mold cavity 1368, filling the mold cavity and flowing against and contacting at least some portions of the laminated microfluidic structure 1300 position therein. After the injection molding operation is complete and the resulting co-molded or overmolded component has cooled sufficiently, then the first mold 1342 and the second mold 1344 may be unsealed and drawn apart, as shown in FIG. 13F, allowing the ejector pins 1366 to be used to eject the co-molded or overmolded part, as shown in FIG. 13G.

Figure 13H:
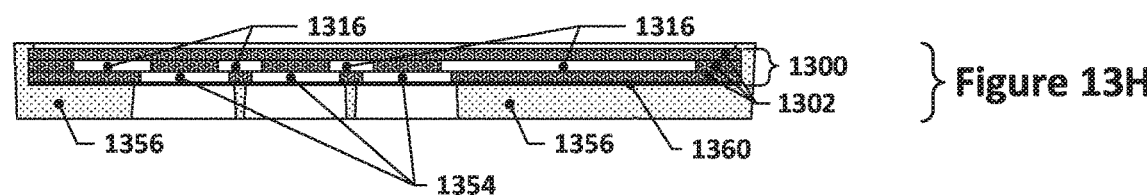

The resulting overmolded or co-molded part, as shown in FIG. 13H, may have microfluidic features within the laminated microfluidic structure 1300 that are tightly integrated with "macroscopic" structures that may allow for more secure connections to be made between the laminated microfluidic structure and other equipment, such as pneumatic control or fluid supply ports on analysis instruments or other equipment.

For example, the three protrusions 1374 may be circular bosses that are sized the same diameter or slightly larger than the diaphragm recesses 1354 with which each corresponds, leaving circular recesses in the underside of the co-molded or overmolded part that may later be interfaced with an interface of an analysis instrument having raised circular bosses of slightly smaller diameter and having o-ring seals around the circumference that may provide an air and/or liquid-tight seal between the walls of each such recess and the corresponding boss, thereby providing a fluid flow conduit that may be used to transport fluids, e.g., reactants, wash fluids, or compressed gas to or from the laminated microfluidic structure. Such structures may, in effect, serve as adapters that allow for a very small microfluidic port feature, e.g., on the order of one to two millimeters or less in diameter, on the microfluidic laminate to be coupled with larger, more robust fluidic connectors, e.g., 4 to 5 millimeters or more, e.g., 10 mm, in diameter or nominal size in a device into which, for example, the co-molded microfluidic structure may be installed. Such an arrangement may avoid difficulties with aligning very small ports on a microfluidic structure with correspondingly small connectors. It will also be recognized that such protrusions may be used to prevent molten polymeric material from flowing into open ports on the exterior surfaces of the laminated microfluidic structure even if an elastomeric membrane is not used; in such instances, the protrusions may simply press against the surfaces of the laminated microfluidic structure directly instead of against the elastomeric membrane.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

It is also to be understood that the use of "to," e.g., "the gas inlet of the cartridge is to receive a gas from the temperature control system," may be replaceable with language such as "configured to," e.g., "the gas inlet of the cartridge is configured to receive a gas from the temperature control system", or the like.

Terms such as "about," "approximately," "substantially," "nominal," or the like, when used in reference to quantities or similar quantifiable properties, are to be understood to be inclusive of values within ±10% of the values specified, unless otherwise indicated.

It is to be understood that the phrases "for each <item> of the one or more <items>," "each <item> of the one or more <items>," or the like, if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

It is also to be understood that the phrases "one or more <items>," "at least one <item>" and "a(n)<item>," or the like, if used herein, should be construed consistently and understood to be inclusive of a single item as well as allowing for more than one of that item, unless otherwise explicitly indicated. For example, if a system comprises or includes a widget, the system may comprise or include one, two, or any number of widgets, and should be construed consistently with a system that comprises or includes at least one widget or one or more widgets.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

While the concepts herein have been described with respect to the Figures, it will be appreciated that many modifications and changes may be made by those skilled in the art without departing from the spirit of the disclosure.

What is claimed is:

1. A method comprising:
(a) forming a laminated microfluidic structure having a first major surface and a second major surface offset from the first major surface by a first distance along an axis perpendicular to the first major surface, wherein the laminated microfluidic structure includes:
   at least two layers, wherein each layer is made of a polymeric material,
   at least one channel that extends in one or more directions parallel to the first major surface and is located within the laminated microfluidic structure, and
   one or more sipper ports that are fluidically connected with one or more features in the laminated microfluidic structure and outside of a first region by the at least one channel;
(b) placing the laminated microfluidic structure in a thermoforming apparatus; and
(c) thermoforming the first region of the laminated microfluidic structure around the one or more sipper ports to cause the first region to distend away from a reference plane defined by undistended portions of the first major surface to form a well with the one or more sipper ports located within the distended first region.

2. The method of claim 1, wherein the laminated microfluidic structure further includes one or more vent ports in the first region fluidically connected with one or more vent channels that lead outside of the first region.

3. The method of claim 1, wherein (c) comprises:
   heating at least the first region to a first temperature above a glass transition temperature of the polymeric material or materials of the at least two layers;
   positioning the at least two layers between (i) a first mold having a protrusion in a location that aligns with the first region when viewed along an axis perpendicular to the reference plane and (ii) a second mold having a recess in a location that aligns with the first region when viewed along an axis perpendicular to the reference plane; and causing, while the first region is heated to the first temperature, one or both of the first mold and the second mold to move along a first axis to deform the at least two layers between the first mold and the second mold and cause the first region to distend into the recess.

4. The method of claim 3, wherein at least one of the protrusion and the recess includes a relief groove on a surface thereof and positioned such that the relief groove at least partially overlaps with the at least one channel during (c) when viewed along an axis perpendicular to the reference plane.

5. The method of claim 1, wherein (c) comprises:

placing the second major surface against a mold with a recess in a location that aligns with the first region when viewed along an axis perpendicular to the reference plane;

heating at least the first region to a first temperature above a glass transition temperature of the polymeric material or materials of the at least two layers; and applying a pressure differential to the laminated microfluidic structure while the second major surface is placed against the mold and the recess is in the location that aligns with the first region to cause the first region to thermoplastically distend into the recess.

6. The method of claim 5, wherein the recess includes a relief groove on a surface thereof and positioned such that the relief groove at least partially overlaps with the at least one channel during (c) when viewed along an axis perpendicular to the reference plane.

7. The method of claim 1, wherein (c) comprises:

placing the first major surface against a mold with a protrusion in a location that aligns with the first region;

heating at least the first region to a first temperature above a glass transition temperature of the polymeric material or materials of the at least two layers; and applying a pressure differential to the laminated microfluidic structure while the first major surface is placed against the mold and the protrusion is in the location that aligns with the first region to cause the first region to thermoplastically distend over the protrusion.

8. The method of claim 7, wherein the protrusion includes a relief groove on a surface thereof and positioned such that the relief groove at least partially overlaps with the at least one channel during (c) when viewed along an axis perpendicular to the reference plane.

9. The method of claim 1, wherein (c) comprises:

heating at least the first region to a first temperature above a glass transition temperature of the polymeric material or materials of the at least two layers; and causing, while the first region is heated to the first temperature, a first pressure field to be applied to the first major surface over the first region and a second pressure field to be applied to the second major surface over the first region, wherein:

the first pressure field is, on average, greater than the second pressure field and results in a pressure field differential between the first major surface and the second major surface, and the pressure field differential causes the first region to distend away from the first major surface.

10. The method of claim 1, further comprising:

dispensing a quantity of reagent into the distended first region, and bonding or adhering a seal over the distended first region after the quantity of reagent is dispensed into the distended first region.

11. The method of claim 1, further comprising:

(d) positioning, after (c), the laminated microfluidic structure within a mold cavity of an injection molding machine mold; and (e) injecting molten polymeric material into the mold cavity to cause at least some of the molten polymeric material to flow against one or more portions of the laminated microfluidic structure positioned therein.

12. The method of claim 11, wherein:

the laminated microfluidic structure includes one or more ports on one or both of the first major surface and the second major surface, and the injection molding machine mold includes one or more protrusions that contact the laminated microfluidic structure around each port of a subset of or all of the one or more ports during (e), thereby preventing the molten polymeric material from flowing into the ports in the subset of or all of the one or more ports during (e).

13. The method of claim 1, further comprising:

obtaining a housing made of a polymeric material;

heating the laminated microfluidic structure to a temperature above a glass transition temperature of the polymeric material or materials of the at least two layers; and pressing one or more portions of the laminated microfluidic structure against the housing to bond the laminated microfluidic structure to the housing.

14. The method of claim 10, wherein the laminated microfluidic structure further includes one or more vent ports in the first region fluidically connected with one or more vent channels that lead outside of the first region.

15. An apparatus comprising:

a thermoformed, laminated microfluidic structure with at least two layers, each layer made of a polymeric material, and having a first major surface and a second major surface offset from the first major surface by a first distance along an axis perpendicular to the first major surface, wherein the laminated microfluidic structure has a first distended region that includes a concave portion of the first major surface and a corresponding convex portion of the second major surface, thereby forming a well;

a sipper port located on the first major surface within the first distended region; and a channel that extends in one or more directions parallel to the first major surface, is located entirely within the laminated microfluidic structure, forms a fully enclosed passage that spans between, and fluidically connects, the sipper port and one or more features of the laminated microfluidic structure located outside of the first distended region, and is interposed between the first major surface and the second major surface.

16. The apparatus of claim 15, further comprising:

a first quantity of reagent located within the concave portion of the first major surface; and a seal that is sealed to the first major surface around the periphery of the first distended region.

17. The apparatus of claim 16, further comprising:

a vent port located on the first major surface within the first distended region and at a location in between the sipper port and an outer edge of the first distended region; and a vent channel that fluidically connects the vent port to a location of the laminated microfluidic structure outside of the first distended region and that is interposed between the first major surface and the second major surface, wherein the vent channel is fluidically isolated from the channel within the laminated microfluidic structure.

18. The apparatus of claim 15, wherein:

the laminated microfluidic structure is a laminated microfluidic structure including at least a first layer and a second layer, the first layer includes a third major surface, the second layer includes a fourth major surface, the third major surface is bonded to the fourth major surface within the first distended region, and the channel is located in one or both of the third major surface and the fourth major surface.

19. The apparatus of claim 15, wherein:

the first distended region is surrounded by a first non-distended region of the laminated microfluidic structure, the first non-distended region of the laminated microfluidic structure defines a first reference plane, and the sipper port is positioned in a location that is spaced away from the first reference plane along an axis perpendicular to the first reference plane by a distance of between 90% and 100% of the distance between the first reference plane and a portion of the first major surface within the first distended region that is furthest from the first reference plane.

20. The apparatus of claim 15, further comprising one or more additional distended regions, each additional distended region having a corresponding additional sipper port and a corresponding additional channel that fluidically connects that additional sipper port to a location of the laminated microfluidic structure outside of the corresponding additional distended region and that is interposed between the first major surface and the second major surface.

\* \* \* \* \*